US012211539B2

(12) United States Patent
Yamazaki et al.

(10) Patent No.: US 12,211,539 B2
(45) Date of Patent: Jan. 28, 2025

(54) SEMICONDUCTOR DEVICE

(71) Applicant: Semiconductor Energy Laboratory Co., Ltd., Atsugi (JP)

(72) Inventors: Shunpei Yamazaki, Setagaya (JP); Hajime Kimura, Atsugi (JP); Atsushi Miyaguchi, Hadano (JP); Yoshiaki Oikawa, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/226,823

(22) Filed: Jul. 27, 2023

(65) Prior Publication Data

US 2024/0029776 A1    Jan. 25, 2024

Related U.S. Application Data

(63) Continuation of application No. 17/836,213, filed on Jun. 9, 2022, now Pat. No. 11,715,509, which is a
(Continued)

(30) Foreign Application Priority Data

Jun. 15, 2018  (JP) ................................. 2018-114810
Jun. 15, 2018  (JP) ................................. 2018-114813

(51) Int. Cl.
*G06N 3/04*     (2023.01)
*G06N 3/063*    (2023.01)
(Continued)

(52) U.S. Cl.
CPC .............. *G11C 11/405* (2013.01); *G06N 3/04* (2013.01); *G06N 3/063* (2013.01); *G06N 3/08* (2013.01);
(Continued)

(58) Field of Classification Search
CPC ........ G11C 11/405; H10B 12/00; G06N 3/06; G06N 3/063; G06N 3/08; H01L 29/7869
See application file for complete search history.

(56) References Cited

U.S. PATENT DOCUMENTS 6,940,740 B2   9/2005  Ueda et al.
8,433,665 B2   4/2013  Tang et al.
(Continued)

FOREIGN PATENT DOCUMENTS

EP    3537344 A    9/2019
JP    03-137897 A  6/1991
(Continued)

OTHER PUBLICATIONS

International Search Report (Application No. PCT/IB2019/054506) Dated Aug. 13, 2019.
(Continued)

*Primary Examiner* — Ly D Pham
(74) *Attorney, Agent, or Firm* — Eric J. Robinson; Robinson Intellectual Property Law Office, P.C.

(57)  ABSTRACT

A semiconductor device that enables lower power consumption and data storage imitating a human brain is provided. The semiconductor device includes a control unit, a memory unit, and a sensor unit. The memory unit includes a memory circuit and a switching circuit. The memory circuit includes a first transistor and a capacitor. The switching circuit includes a second transistor and a third transistor. The first transistor and the second transistor include a semiconductor layer including a channel formation region with an oxide semiconductor, and a back gate electrode. The control unit has a function of switching a signal supplied to the back gate electrode, in accordance with a signal obtained at the sensor unit.

16 Claims, 18 Drawing Sheets

Related U.S. Application Data continuation of application No. 16/972,693, filed as application No. PCT/IB2019/054506 on May 31, 2019, now Pat. No. 11,361,807.

(51) Int. Cl.
   *G06N 3/08*    (2023.01)
   *G11C 11/405*  (2006.01)
   *H01L 29/786*  (2006.01)
   *H10B 12/00*   (2023.01)

(52) U.S. Cl.
   CPC .......... H01L 29/7869 (2013.01); H10B 12/00 (2023.02)

(56) References Cited

U.S. PATENT DOCUMENTS

| | | |
|---|---|---|
| 9,934,826 B2 | 4/2018 | Kurokawa |
| 10,141,069 B2 | 11/2018 | Ikeda. et al. |
| 10,192,871 B2 | 1/2019 | Onuki et al. |
| 10,699,794 B2 | 6/2020 | Ikeda et al. |
| 10,922,605 B2 | 2/2021 | Kurokawa |
| 11,308,386 B2 | 4/2022 | Wang et al. |
| 11,361,807 B2 | 6/2022 | Yamazaki et al. |
| 11,893,474 B2 | 2/2024 | Kurokawa |
| 2003/0142533 A1 | 7/2003 | Ueda et al. |
| 2012/0011090 A1 | 1/2012 | Tang et al. |
| 2012/0163071 A1 | 6/2012 | Kurokawa |
| 2012/0257439 A1 | 10/2012 | Kurokawa |
| 2014/0184165 A1 | 7/2014 | Takahashi et al. |
| 2014/0184314 A1 | 7/2014 | Takahashi et al. |
| 2016/0110642 A1 | 4/2016 | Matsuda et al. |
| 2016/0343452 A1 | 11/2016 | Ikeda et al. |
| 2017/0301376 A1 | 10/2017 | Kurokawa |
| 2017/0337149 A1 | 11/2017 | Onuki et al. |
| 2017/0358334 A1 | 12/2017 | Onuki |
| 2018/0026612 A1 | 1/2018 | Kurokawa |
| 2018/0061307 A1 | 3/2018 | Inoue et al. |
| 2018/0069515 A1 | 3/2018 | Inoue |
| 2018/0090498 A1 | 3/2018 | Onuki et al. |
| 2018/0138212 A1 | 5/2018 | Yamazaki et al. |
| 2018/0166392 A1 | 6/2018 | Yamazaki et al. |
| 2018/0166578 A1 | 6/2018 | Yamazaki et al. |
| 2019/0286969 A1 | 9/2019 | Wang et al. |
| 2020/0176069 A1 | 6/2020 | Ikeda et al. |
| 2024/0176997 A1 | 5/2024 | Kurokawa |

FOREIGN PATENT DOCUMENTS

| | | |
|---|---|---|
| JP | 2003-163332 A | 6/2003 |
| JP | 2013-534676 | 9/2013 |
| JP | 2016-219011 A | 12/2016 |
| JP | 2017-102905 A | 6/2017 |
| JP | 2017-194963 A | 10/2017 |
| JP | 2018-056558 A | 4/2018 |
| JP | 2018-097639 A | 6/2018 |
| JP | 2020-501252 | 1/2020 |
| WO | WO-2012/006469 | 1/2012 |
| WO | WO-2017/068491 | 4/2017 |
| WO | WO-2017/178947 | 10/2017 |
| WO | WO-2018/094717 | 5/2018 |
| WO | WO-2019/111104 | 6/2019 |

OTHER PUBLICATIONS

Written Opinion (Application No. PCT/IB2019/054506) Dated Aug. 13, 2019.

SEMICONDUCTOR DEVICE

TECHNICAL FIELD

One embodiment of the present invention relates to a semiconductor device. One embodiment of the present invention relates to, in particular, a semiconductor device capable of imitating human brain's storage of information.

In this specification and the like, a semiconductor device generally refers to devices that can function by utilizing semiconductor characteristics.

BACKGROUND ART

A von Neumann computer, which is used in development of artificial intelligence (AI) has been overwhelming humans in terms of calculation speed.

By contrast, human brains are capable of making a right judgment by comparing fragmentary input information and memory and supplementing the information. Human brains are also capable of solving a problem, which is difficult for a computer, through association with memories from a wide range of fields or by using creativity and foresight.

With improvement in computer performance in recent years, large-scale calculation such as learning and inference with the use of a neural network has become possible. In addition, drastic improvement in computer's recognition accuracy with the use of deep learning in a field of machine learning has been reported (see Patent Document 1, for example). In fields that require creativity and foresight, such as shogi and go, problems that used to be difficult for computers have now become possible to be solved by computers.

REFERENCE

Patent Document

[Patent Document 1] United States Patent Application Publication No. 2016/0110642

SUMMARY OF THE INVENTION

Problems to be Solved by the Invention

The capability of conventional artificial intelligence devices falls far short of human brains in terms of power efficiency. In hardware such as CPU and GPU, arithmetic processing is performed while storing data by using memory elements such as SRAM and DRAM, which are made up of Si transistors. The downsizing of memory elements made up of Si transistors resulted in increase of leakage current, and along with increase of the circuit scale for higher computer performance, resulted in further increase in power consumption.

Furthermore, the information storing function of memory elements of conventional artificial intelligence devices is uniform. For example, most of memory elements such as SRAM and DRAM write/read data of 0 or 1. By contrast, human brains have variety of information storage, including information storing methods such as long-term memory and short-term memory, and transfer of information storing locations such as memory at the cerebral neocortex and memory at the hippocampus.

An object of one embodiment of the present invention is to provide a semiconductor device with a novel structure. Another object of one embodiment of the present invention is to provide a semiconductor device that can operate with lower power consumption. Another object of one embodiment of the present invention is to provide a semiconductor device capable of imitating human brain's storage of information.

Note that the description of these objects does not preclude the existence of other objects. In one embodiment of the present invention, there is no need to achieve all the objects. In addition, other objects will be apparent from and can be derived from the description of the specification, the drawings, the claims, and the like.

Means for Solving the Problems

One embodiment of the present invention is a semiconductor device including a control unit, a memory unit, and a sensor unit, in which the memory unit includes a memory circuit and a switching circuit, the memory circuit includes a first transistor and a capacitor, the switching circuit includes a second transistor and a third transistor, the first transistor and the second transistor include a semiconductor layer including a channel formation region with an oxide semiconductor, and the control unit has a function of switching a signal supplied to the first transistor and the second transistor, in accordance with a signal obtained at the sensor unit.

One embodiment of the present invention is a semiconductor device including a control unit, a memory unit, and a sensor unit, in which the memory unit includes a memory circuit and a switching circuit, the memory circuit includes a first transistor and a capacitor, the switching circuit includes a second transistor and a third transistor, the first transistor and the second transistor include a semiconductor layer including a channel formation region with an oxide semiconductor, and a back gate electrode, and the control unit has a function of switching a signal supplied to the back gate electrode, in accordance with a signal obtained at the sensor unit.

One embodiment of the present invention is a semiconductor device including a control unit, a memory unit, and a sensor unit, in which the memory unit includes a memory circuit and a switching circuit, the memory circuit includes a first transistor and a capacitor, one of a source and a drain of the first transistor is electrically connected to one electrode of the capacitor, the switching circuit includes a second transistor and a third transistor, one of a source and a drain of the second transistor is electrically connected to a gate of the third transistor, the first transistor and the second transistor include a semiconductor layer including a channel formation region with an oxide semiconductor, and a back gate electrode, and the control unit has a function of switching a signal supplied to the back gate electrode, in accordance with a signal obtained at the sensor unit.

One embodiment of the present invention is a semiconductor device including a control unit, a memory unit, and a sensor unit, in which the memory unit includes a memory circuit and a switching circuit, the memory circuit includes a first transistor and a capacitor, the switching circuit includes a second transistor and a third transistor, the first transistor and the second transistor include a semiconductor layer including a channel formation region with an oxide semiconductor, and a gate electrode, and the control unit has a function of switching a signal supplied to the gate electrode, in accordance with a signal obtained at the sensor unit.

One embodiment of the present invention is a semiconductor device including a control unit, a memory unit, and a sensor unit, in which the memory unit includes a memory circuit and a switching circuit, the memory circuit includes a first transistor and a capacitor, one of a source and a drain of the first transistor is electrically connected to one electrode of the capacitor, the switching circuit includes a second transistor and a third transistor, one of a source and a drain of the second transistor is electrically connected to a gate of the first transistor, the first transistor and the second transistor include a semiconductor layer including a channel formation region with an oxide semiconductor, and a gate electrode, and the control unit has a function of switching a signal supplied to the gate electrode, in accordance with a signal obtained at the sensor unit.

In one embodiment of the present invention, a semiconductor device in which the memory circuit includes a fourth transistor, and one of the source and the drain of the second transistor is electrically connected to a gate of the fourth transistor is preferable.

Effect of the Invention

According to one embodiment of the present invention, a semiconductor device with a novel structure can be provided. According to one embodiment of the present invention, a semiconductor device that can operate with low power consumption can also be provided. One object of one embodiment of the present invention is to provide a semiconductor device capable of imitating human brain's storage of information.

Note that the description of the effects does not preclude the existence of other effects. In one embodiment of the present invention, there is no need to achieve all the effects. Other effects will be apparent from and can be derived from the descriptions of the specification, the drawings, the claims, and the like.

MODE FOR CARRYING OUT THE INVENTION

Figure 1:
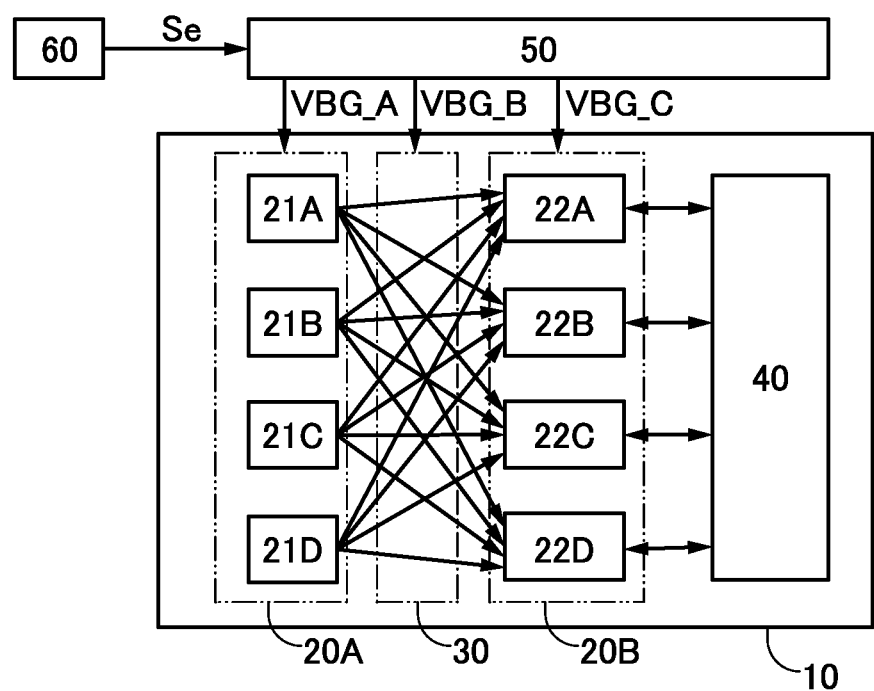
FIG. 1 A block diagram illustrating a structure example of a semiconductor device.

Embodiments will be described below with reference to the drawings. However, the embodiments can be implemented with various modes, and it will be readily appreciated by those skilled in the art that modes and details can be changed in various ways without departing from the spirit and scope of the present invention. Therefore, the present invention should not be construed as being limited to the description of embodiments below.

In the drawings, the size, the layer thickness, or the region is sometimes exaggerated for clarity. Thus, the size, the layer thickness, or the region is not limited to the illustrated scale. Note that the drawings schematically show ideal examples, and embodiments of the present invention are not limited to shapes or values shown in the drawings.

Furthermore, in the present specification, the embodiments described below can be combined as appropriate. In addition, in the case where a plurality of structure examples are described in one embodiment, the structure examples can be combined as appropriate.

A semiconductor device of one embodiment of the present invention will be described below. In this embodiment, a semiconductor device capable of achieving a memory ability close to that of human brains, in particular, will be described.

Structure Example 1 of Semiconductor Device

FIG. 1 is an example of a block diagram for describing a structure of a semiconductor device. The semiconductor device in FIG. 1 includes a sensor unit 60, a control unit 50, and a memory unit 10. The memory unit 10 includes, for example, memory circuits 20A and 20B, a switching circuit 30, and an input/output circuit 40.

Note that although FIG. 1 illustrates one sensor unit 60, one control unit 50, and one memory unit 10, a structure provided with a plurality of sensor units 60, control units 50, and memory units 10 may be employed. Furthermore, without being limited to the structure shown in FIG. 1, a structure provided with a plurality of memory circuits 20A and 20B, switching circuits 30, and input/output circuits 40 may be employed.

The memory circuit 20A includes a plurality of memory circuits (memory circuits 21A to 21D are shown in FIG. 1). The memory circuits 21A to 21D each include a plurality of memory elements. Although not illustrated in the figure, the memory circuits 21A to 21D include a driver circuit for driving the plurality of memory elements. The driver circuit has a function capable of switching a back gate voltage to be applied to a back gate electrode of a transistor, in accordance with the control by the control unit 50. The memory circuits 21A to 21D have a function capable of changing the information storing ability in accordance with a signal Se obtained at the sensor unit 60. Note that information may be read as data in some cases. Note that in a memory circuit, information is stored as a voltage value or a charge amount that corresponds to data.

The memory circuits 21A to 21D include memory elements capable of changing the information storing ability in accordance with the back gate voltage applied to the transistor, for example. The control unit 50 can control, for example, the memory circuit 21A and the memory circuit 21B such that the memory elements in the memory circuit 21A are capable of storing long-term information and the memory elements in the memory circuit 21B are capable of storing short-term information.

The memory circuit 20B includes a plurality of memory circuits (memory circuits 22A to 22D are shown in FIG. 1), similarly to the memory circuit 20A. The memory circuits 22A to 22D each include a plurality of memory elements. Although not illustrated in the figure, the memory circuits 22A to 22D include a driver circuit for driving the plurality of memory elements. The driver circuit has a function capable of switching a back gate voltage to be applied to a back gate electrode of a transistor, in accordance with the control by the control unit 50. The memory circuits 22A to 22D have a function capable of changing the information storing ability in accordance with a signal Se obtained at the sensor unit 60.

The memory circuits 21A to 21D include memory elements capable of changing the information storing ability in accordance with the back gate voltage applied to the transistor, for example. The control unit 50 can control, for example, the memory circuit 21A and the memory circuit 21B such that the memory elements in the memory circuit 21A are capable of storing long-term information and the memory elements in the memory circuit 21B are capable of storing short-term information.

DOSRAM or NOSRAM is preferable as a memory circuit that can be used for the memory circuits 20A and 20B. DOSRAM (registered trademark) stands for "dynamic oxide semiconductor random access memory (RAM)", which is a RAM including a 1T (transistor) 1C (capacitor) memory cell. NOSRAM (registered trademark) stands for "nonvolatile oxide semiconductor RAM", which is RAM including a gain cell (2T or 3T) memory cell. DOSRAM and NOSRAM are each a memory that utilizes low off-state current of an OS transistor (a transistor including an oxide semiconductor in its channel formation region).

DOSRAM is DRAM formed using an OS transistor, and DOSRAM is a memory that temporarily stores information sent from the outside. DOSRAM includes a memory cell including an OS transistor and a read circuit unit including an Si transistor (a transistor including silicon in its channel formation region). Since the memory cell and the read circuit unit can be provided in different layers that are stacked, the entire circuit area of DOSRAM can be small. Furthermore, DOSRAM can be efficiently placed, with a memory cell array being finely divided.

NOSRAM is a nonvolatile memory including an OS transistor. Power consumption of NOSRAM in writing data is smaller than the other nonvolatile memories such as a flash memory, a resistive random access memory (ReRAM), and a magnetoresistive random access memory (MRAM). Furthermore, unlike a flash memory and a ReRAM which deteriorate by data writing, the NOSRAM does not have a limit on the number of times of data writing. Furthermore, NOSRAM can store multilevel data of two or more bits as well as one-bit binary data. The multilevel data storage in NO SRAM leads to a reduction of the memory cell area per bit.

Furthermore, NOSRAM can store analog data as well as digital data. Thus, the memory circuits 20A and 20B can be used as analog memories. Since NOSRAM can store analog data as it is, a D/A converter circuit and an A/D converter circuit are unnecessary. Thus, the area of a peripheral circuit for NOSRAM can be reduced.

Note that in one embodiment of the present invention, a structure in which NOSRAM or DOSRAM is used for circuits included in the memory circuits 20A and 20B is described; however, one embodiment of the present invention is not limited thereto. In the case where the use of nonvolatile memories such as a ReRAM and an MRAM sufficiently reduces power consumption along with the future technological innovation, for example, a structure in which such nonvolatile memories are used for circuits included in the memory circuits 20A and 20B may be employed, depending on circumstances.

The switching circuit 30 has a function capable of controlling electrical connection between the memory circuits 20A and 20B in accordance with control by the control unit 50. The switching circuit 30 has a function of controlling the amount of current flowing between the memory circuits 21A to 21D and the memory circuits 22A to 22D, for example. In other words, the switching circuit 30 has a function capable of switching transmission of information between the plurality of memory circuits. The switching circuit 30 has a function capable of changing, in accordance with the back gate voltage applied to the transistor, the amount of current flowing between the memory circuits 21A to 21D and the memory circuits 22A to 22D in accordance with the signal Se obtained at the sensor unit 60. The switching circuit 30 is referred to as a reconfigurable circuit (reconfiguration circuit) in some cases.

The switching circuit 30 includes a memory element that controls the amount of current flowing between the memory circuits, and a semiconductor element for allowing current to flow in accordance with the information stored in the memory element. The switching circuit 30 has a function capable of changing the information stored in the memory element through control by the control unit 50 of the back gate voltage to be applied to the transistor. Note that FIG. 1 shows arrows between the memory circuits 20A and 20B as pointing in one direction; however, depending on the flow of information, the arrows may be shown as two-way arrows.

The switching circuit 30 is a programmable device where the memory element includes an OS transistor. Note that in this specification and the drawings, a programmable device including an OS transistor is referred to as an OS-FPGA. Moreover, information stored in a memory element of the OS-FPGA is referred to as configuration data.

An OS-FPGA can have a smaller memory area than an FPGA where a memory element is formed using an SRAM. Thus, adding a context switching function only causes a small increase in area. Moreover, an OS-FPGA can transmit data and parameters at high speed by utilizing the boosting.

Examples of the sensor unit 60 are a variety of sensors such as a brain wave sensor, a pulse wave sensor, a blood pressure sensor, and a temperature sensor for obtaining information like biological information such as brain waves, pulse, blood pressure, and body temperature. Although FIG. 1 illustrates a state where the signal Se is output from one sensor, a structure where signals obtained at a plurality of sensors are input to the control unit 50 may be employed.

The control unit 50 includes arithmetic circuits such as a CPU (central processing unit) and a GPU (graphics processing unit), and memory circuits such an SRAM (static random access memory). The control unit 50 has a function of outputting voltages VBG_A to VBG_C in accordance with the signal Se output from the sensor unit 60. The control unit 50 can perform output in response to input, with the use of arithmetic processing or the like based on an artificial neural network, for example.

The voltages VBG_A to VBG_C are voltages applied to a back gate electrode of a transistor included in each of the memory circuits 20A and 20B and the switching circuit 30, or signals capable of switching the voltages applied to the back gate. FIG. 1 illustrates a state where the voltage VBG_A is output to the memory circuit 20A. In FIG. 1, the voltage VBG_A is not limited to a voltage with a certain single value, and a structure where the voltage VBG_A is controlled as different voltages to be applied to back gate electrodes in the memory circuits 21A to 21D included in the memory circuit 20A can be employed. Similarly, for the memory circuit and the switching circuit 30, a structure where the voltage VBG_B or VBG_C is controlled as different voltages to be applied to back gate electrodes in different memory circuits can be employed.

Note that the control unit 50 can switch control of the voltages VBG_A to VBG_C in accordance with the signal Se output from the sensor unit 60. For example, control of the voltages VBG_A to VBG_C can be switched between the case where the same signal Se is input repetitively and the case where the signal Se with high intensity or low intensity is input.

The input/output circuit 40 is a circuit for controlling input/output of information to/from the memory circuit 20A, the memory circuit 20B, and the switching circuit 30. The input/output circuit 40 may be provided outside the memory unit 10.

Figure 2:
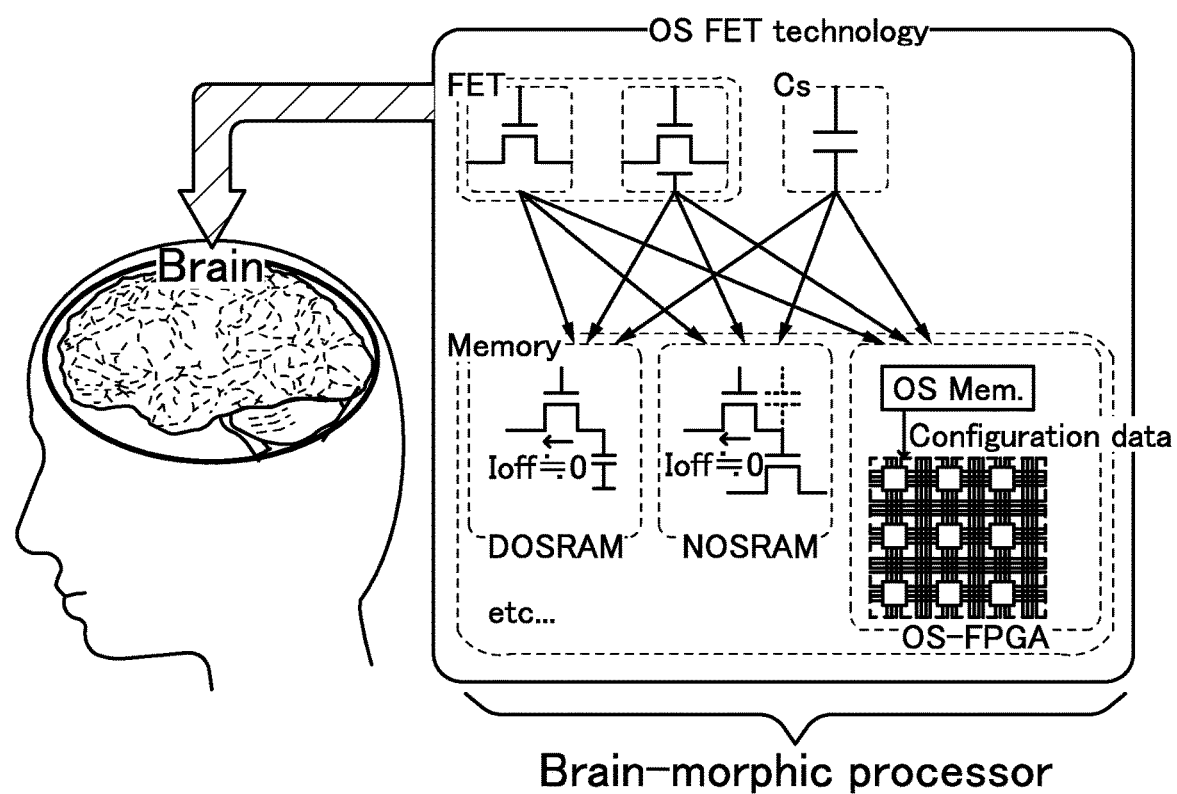
FIG. 2 A conceptual diagram for describing a semiconductor device.

FIG. 2 schematically illustrates how the function of a human brain (Brain) is imitated with the use of memory circuits and switching circuits that include OS transistors.

As illustrated in FIG. 2, in one embodiment of the present invention, the technology of a transistor including an oxide semiconductor (also referred to as an OS transistor) (such a technology is referred to as an OS FET technology) is utilized in order to have a structure that imitates the function of a human brain (Brain). Examples of OS transistor technologies include a transistor (also referred to as an FET), and a capacitor (also referred to as a condenser or Cs) electrically connected to the transistor. In addition, the use of one or more memories that are formed using the FET, Cs, and the like to constitute an arithmetic device, a register, a peripheral circuit, or the like enables functions as a processor.

In this specification and the like, the above processor can be used as a brain processor (also referred to as a brain-morphic processor or a BM processor). Note that the DOSRAM, NOSRAM and OS-FPGA shown in FIG. 2 will be described later. Note that the OS memory (also referred to as an OS mem.) in the OS-FPGA is a memory including an OS transistor, and stores configuration data of the OS-FPGA.

Note that in the NOSRAM shown in FIG. 2, a capacitor is illustrated by dashed lines. Parasitic capacitance that can be generated between a wiring and another wiring formed in a different layer can be used as the capacitor, for example. Note that the capacitor of the NOSRAM shown in FIG. 2 is illustrated by dashed lines because it is not intentionally formed capacitance.

In the structure of one embodiment of the present invention, a structure where the memory circuit and the switching circuit including OS transistors are used is employed, so that information (data) is stored by utilizing the extreme lowness of a leakage current flowing between a source and a drain when the transistor is off (hereinafter such a leakage current is referred to as an off-state current). Storage of information can be achieved by retention of a charge corresponding to data in a node having storage capacitance or parasitic capacitance.

In a memory circuit including an OS transistor, information can be rewritten by charging or discharging of electric charge, which means that substantially unlimited times of data write and read are possible. A memory circuit including an OS transistor is superior in rewrite endurance because, unlike a magnetic memory or a resistive random-access memory, it does not go through atomic-level structure change. In addition, unstableness due to the increase of electron trap centers is not observed in a memory circuit including an OS transistor even when rewrite operation is repeated like in a flash memory.

Furthermore, a memory circuit including an OS transistor can freely be placed over a circuit including an Si transistor or the like, so that integration can be easy. In addition, since an OS transistor can be fabricated using manufacturing equipment similar to that of an Si transistor, the fabrication is possible at low costs.

Moreover, an OS transistor can be a four-terminal semiconductor element including a back gate electrode in addition to a gate electrode, a source electrode, and a drain electrode. An electric network where input/output of signals flowing between a source and a drain can be independently controlled in accordance with a voltage applied to the gate electrode or the back gate electrode can be constituted. Thus, circuit design with the same ideas as those of an LSI is possible. In addition, an OS transistor has electric characteristics superior to those of an Si transistor under high-temperature environments. Specifically, an OS transistor is capable of good switching operation under high temperatures ranging from 125° C. to 150° C. inclusive, since its on-state current/off-state current ratio is high.

With the structure of the semiconductor device disclosed in this embodiment, the formation and process of long-term memory and the formation and process of short-term memory in a human brain can be achieved by semiconductor devices including an OS transistor. Thus, data can be stored by the function closer to a human brain than a conventional case. In addition, data can be retained with extremely low power. In other words, a brain processor can be driven with extremely low power consumption, similarly to a human brain.

Configuration Example 1 of NOSRAM and DOSRAM

The memory circuits 21A to 21D or 22A to 22D are circuit configurations including an OS transistor. An example of the circuit configuration and operation will be described with reference to FIGS. 3(A) to 3(C) and FIGS. 4(A) to 4(C).

Figure 3A:
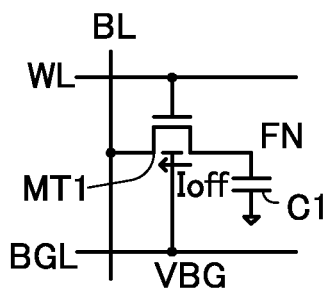
FIG. 3 (A) to (C) A circuit diagram, a graph, and a flowchart showing a structure example of a semiconductor device.
Figure 3B:
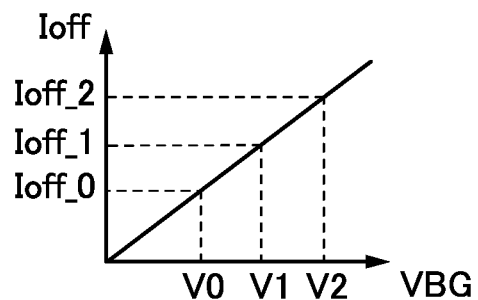

FIG. 3(A) shows a circuit diagram of a memory element having the circuit configuration of DOSRAM. FIG. 3(A) shows a transistor MT1, a capacitor C1, a word line WL, a bit line BL, and a back gate potential line BGL.

The transistor MT1 is an OS transistor, which is a four-terminal element including a back gate electrode. The back gate electrode is connected to the back gate potential line BGL, thereby being supplied with a potential VBG. An off-state current of the transistor MT1 is indicated as Ioff in the figure. A node that retains charge, i.e., a node of a wiring to which the transistor MT1 and the capacitor C1 are connected is indicated as a node FN in FIG. 3(A).

The bit line BL has a function of transmitting information (data or data potential) to be written to the memory element. The word line WL has a function of transmitting a signal for controlling on/off of the transistor MT1. The back gate potential line BGL has a function of transmitting the potential VBG to the back gate electrode of the transistor MT1. The bit line BL, the word line WL, and the back gate potential line BGL are each simply referred to as a wiring in some cases.

The potential VBG is controlled by the control unit 50 as a potential different between memory elements included in the memory circuits 21A to 21D, for example. In the case where the back gate potential at the time when information is stored in the memory circuit 21A is V1, the back gate potential at the time when information is stored in the memory circuit 21B is V0 (<V1), and the back gate potential at the time when information is stored in the memory circuit 21C is V2 (>V1); the off-state current Ioff of the transistor MT1 is as shown in the graph in FIG. 3(B). That is, in accordance with the magnitude relation between back gate potentials, that between off-state currents is as follows: Ioff_2>Ioff_1>Ioff_0. The higher the off-state current is, the more likely the charge retained at the node FN is to change, and the lower the off-state current is, the less likely the charge retained at the node FN is to change. Consequently, information retention terms can be varied between memory circuits.

The above configuration enables the memory circuits 21A to 21D or 22A to 22D to have functions of storing information with different memory abilities in accordance with the signal Se obtained at the sensor unit 60.

Figure 3C:
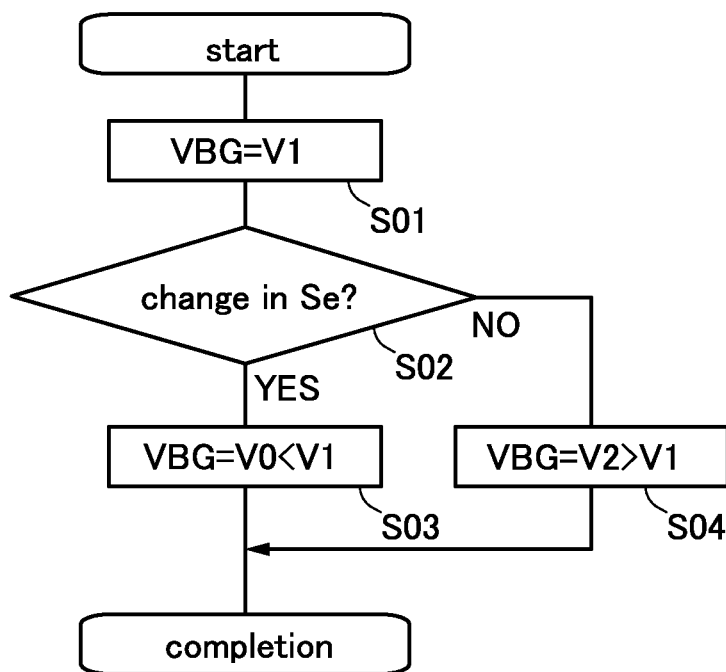

FIG. 3(C) shows a flowchart for describing the operation of the above-described DOSRAM.

In Step S01, information is stored in the memory circuit with the potential VBG supplied as the back gate potential being V1.

In Step S02, whether or not there is a change in the signal Se output from the sensor unit 60 is determined. The determination of whether or not there is a change in the sensor signal is preferably a structure where a plurality of thresholds are set and the potential VBG supplied as a back gate potential is controlled in accordance with the magnitude relation between the threshold and the sensor output.

In the case where there is a change in Step S02, the operation goes to Step S03, and information is stored in the memory circuit with the potential VBG supplied as a back gate potential being V0 which is lower than V1. In other words, the potential VBG is switched so that the information retention time in the memory circuit is increased.

In the case where there is no change or only a small change in Step S03, the operation goes to Step S04, and information is stored in the memory circuit with the voltage VBG supplied as a back gate potential being V2 which is higher than V1. In other words, the potential VBG is switched so that the information retention time in the memory circuit is decreased.

With this structure, a function of storing information with different memory abilities in accordance with the output of the sensor unit can be achieved. When the sensor unit is a temperature sensor, for example, the following function can be achieved: information storage under high temperatures or low temperatures is stored for a long period, and information storage under room temperature is lost after a certain period.

Figure 4A:
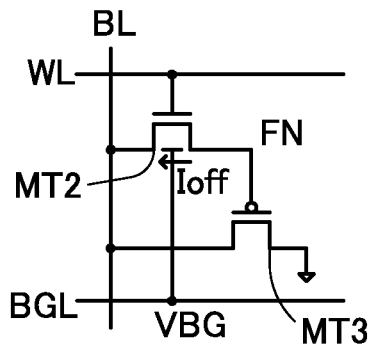
FIG. 4 (A) to (C) A circuit diagram, a graph, and a flowchart showing a structure example of a semiconductor device.
Figure 4B:
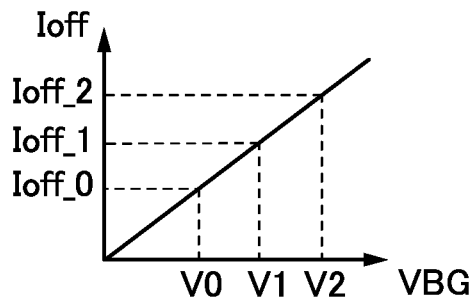

FIG. 4(A) shows a circuit diagram of a memory element having the circuit configuration of NOSRAM. FIG. 4(A) shows a transistor MT2, a transistor MT3, a word line WL, a bit line BL, and a back gate potential line BGL.

The transistor MT2 is an OS transistor, which is a four-terminal element including a back gate electrode. The back gate electrode is connected to the back gate potential line BGL, thereby being supplied with a potential VBG. An off-state current of the transistor MT2 is indicated as Ioff in the figure. A node that retains charge, i.e., a node of a wiring to which the transistor MT2 and the gate of the transistor MT3 are connected is indicated as a node FN in FIG. 4(A).

Note that although the transistor MT3 is illustrated as a p-channel transistor in FIG. 4(A), the transistor MT3 may be an n-channel transistor. Although FIG. 4(A) shows a 2T-type provided with two transistors, it can be a 2T1C-type including a capacitor, or a 3T-type combined with another transistor. Note that the capacitor connected to the node FN can be omitted when parasitic capacitance such as the gate capacitance of the transistor MT3 is increased. Alternatively, the parasitic capacitance may be actively utilized as capacitance as shown in FIG. 2.

The potential VBG is controlled by the control unit 50 as a potential different between memory elements included in the memory circuits 21A to 21D, for example. In the case where the potential VBG supplied as the back gate potential at the time when information is stored in the memory circuit 21A is V1, the potential VBG supplied as the back gate potential at the time when information is stored in the memory circuit 21B is V0 (<V1), and the potential VBG supplied as the back gate potential at the time when information is stored in the memory circuit 21C is V2 (>V1); the off-state current Ioff of the transistor MT2 is as shown in the graph in FIG. 4(B). That is, in accordance with the magnitude relation between the potentials VBG, that between off-state currents is as follows: Ioff_2>Ioff_1>Ioff_0. The higher the off-state current is, the more likely the charge retained at the node FN is to change, and the lower the off-state current is, the less likely the charge retained at the node FN is to change. Consequently, information retention terms can be varied between memory circuits.

The above configuration enables the memory circuits 21A to 21D or 22A to 22D to have functions of storing information with different memory abilities in accordance with the signal Se obtained at the sensor unit 60.

Figure 4C:
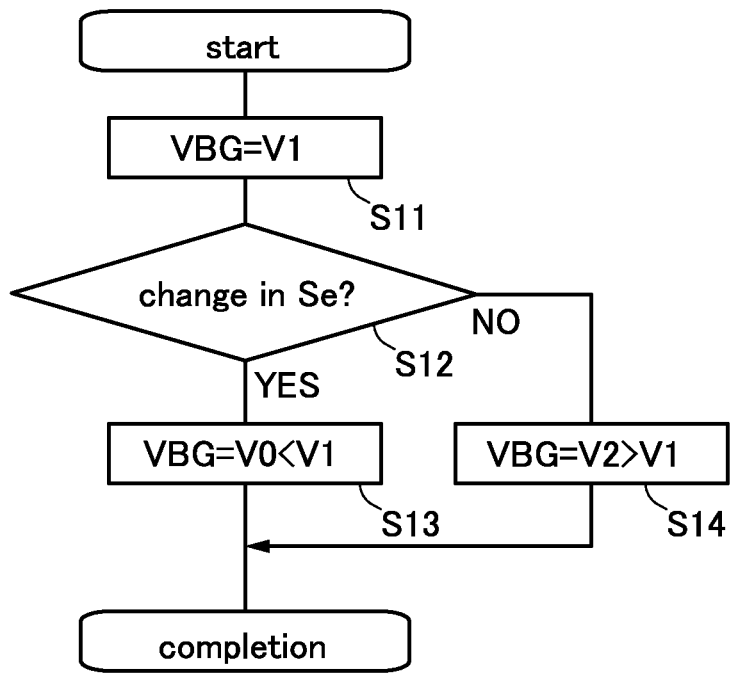

FIG. 4(C) shows a flowchart for describing the operation of the above-described NOSRAM.

In Step S11, information is stored in the memory circuit with the potential VBG supplied as the back gate potential being V1.

In Step S12, whether or not there is a change in the signal Se output from the sensor unit is determined. The determination of whether or not there is a change in the sensor signal is preferably a structure where a plurality of thresholds are set and the potential VBG supplied as a back gate potential is controlled in accordance with the magnitude relation between the threshold and the sensor output.

In the case where there is a change in Step S12, the operation goes to Step S13, and information is stored in the memory circuit with the potential VBG supplied as a back gate potential being V0 which is lower than V1. In other words, the potential VBG is switched so that the information retention time in the memory circuit is increased.

In the case where there is no change or only a small change in Step S13, the operation goes to Step S14, and information is stored in the memory circuit with the voltage VBG supplied as a back gate potential being V2 which is higher than V1. In other words, the potential VBG is switched so that the information retention time in the memory circuit is decreased.

With this structure, a function of storing information with different memory abilities in accordance with the output of the sensor unit can be achieved. When the sensor unit is a temperature sensor, for example, the following function can be achieved: information storage under high temperatures or low temperatures is stored for a long period, and information storage under room temperature is lost after a certain period.

Configuration Example 1 of Switching Circuit

The switching circuit 30 has a circuit configuration with an OS transistor. An example of the circuit configuration and operation will be described with reference to FIGS. 5(A) to 5(C) and FIGS. 6(A) to 6(D).

Figure 5A:
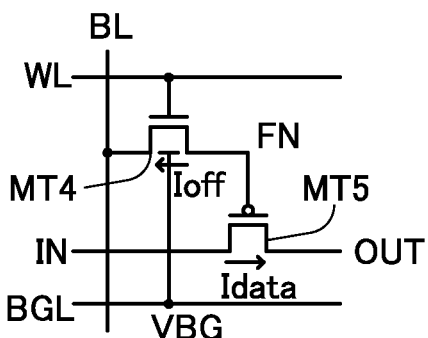
FIG. 5 (A) to (C) A circuit diagram, a graph, and a flowchart showing a structure example of a semiconductor device.

FIG. 5(A) shows a circuit diagram of a memory element having the circuit configuration of the switching circuit 30 placed between a pair of memory circuits. FIG. 5(A) shows a transistor MT4, a transistor MT5, a word line WL, a bit line BL, a back gate potential line BGL, an input terminal IN, and an output terminal OUT.

The transistor MT4 is an OS transistor, which is a four-terminal element including a back gate electrode. The back gate electrode is connected to the back gate potential line BGL, thereby being supplied with a potential VBG. An off-state current of the transistor MT4 is indicated as Ioff in the figure. A node that retains charge, i.e., a node of a wiring to which the transistor MT4 and the gate of the transistor MT5 are connected is indicated as a node FN in FIG. 5(A).

The transistor MT5 is an Si transistor or an OS transistor. A current flowing through the transistor MT5 in accordance with the potential of the node FN, i.e., a current flowing between the input terminal IN and the output terminal OUT is indicated as Idata in the figure.

Note that although the transistor MT5 is illustrated as a p-channel transistor in FIG. 5(A), the transistor MT5 may be an n-channel transistor. Although FIG. 5(A) shows a 2T-type provided with two transistors, it can be a 2T1C-type including a capacitor, or a 3T-type combined with another transistor. Note that the capacitor connected to the node FN can be omitted when parasitic capacitance such as the gate capacitance of the transistor MT5 is increased.

Figure 5B:
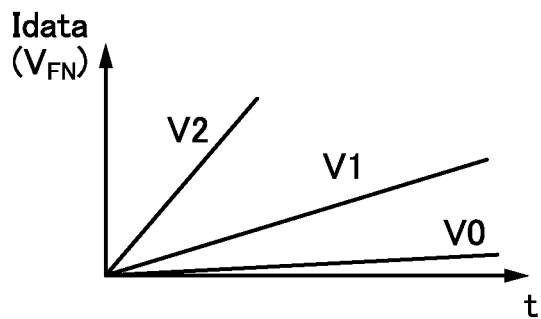

The potential VBG is controlled by the control unit 50 as a potential different between switching circuits each provided between wirings between any one of the memory circuits 21A to 21D and any one of the memory circuits 22A to 22D, for example. In the case where the back gate potential of the transistor MT4 included in the switching circuit provided between the memory circuit 21A and the memory circuit 22A is V1, the back gate potential of the transistor MT4 included in the switching circuit provided between the memory circuit 21B and the memory circuit 22B is V0 (<V1), and the back gate potential of the transistor MT4 included in the switching circuit provided between the memory circuit 21C and the memory circuit 22C is V2 (>V1); the off-state current Ioff of the transistor MT4 is varied in the amount of off-state current. At this time, when an H-level potential is retained at the node FN, there arises a difference in a potential ($V_{FN}$) of the node FN in accordance with the amount of the off-state current. Thus, there arises a difference in the current Idata flowing in accordance with the potential of the node FN. That is, as shown in FIG. 5(B), there arises a difference in the amount of the current Idata that changes with elapsed time (t), in accordance with the magnitude relation between the back gate potentials. As a result, the amount of current flowing between the memory circuits can be varied between the memory circuits.

With this structure, the switching circuit provided between wirings between any one of the memory circuits 21A to 21D and any one of the memory circuits 22A to 22D achieves a function of causing a difference in the amount of current flowing between the memory circuits, in accordance with the signal Se obtained at the sensor unit 60.

Figure 5C:
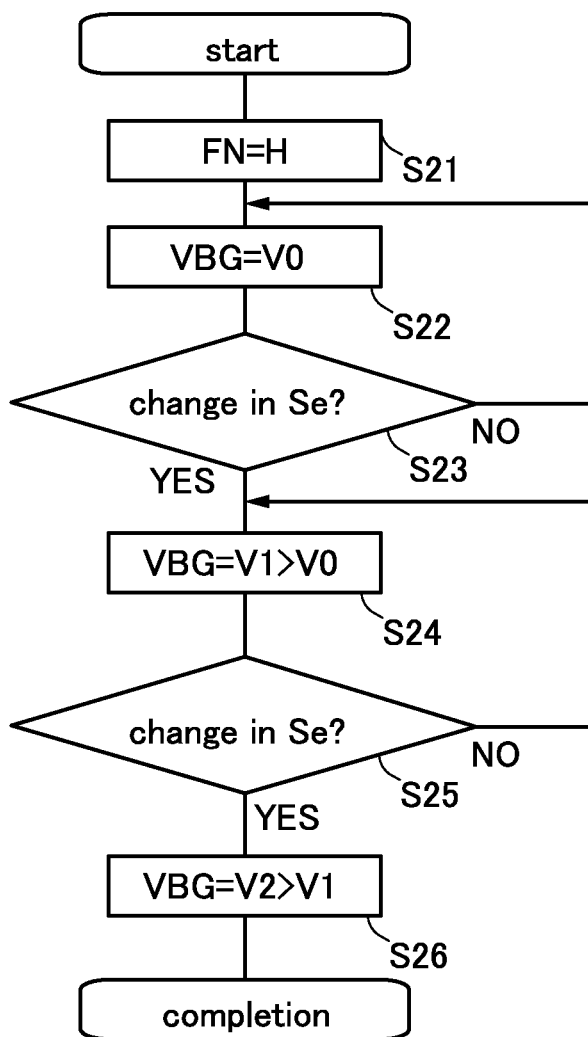

FIG. 5(C) shows a flowchart for describing the operation of the above-described switching circuit.

In Step S21, the potential VBG supplied as the node FN is set at an H level, that is, data with which the current Idata does not flow.

In Step S22, the potential VBG supplied as the back gate potential is set to V0, and the off-state current Ioff of the transistor MT4 is made extremely low.

In Step S23, whether or not there is a change in the signal Se output from the sensor unit 60 is determined. The determination of whether or not there is a change in the sensor signal is preferably a structure where a plurality of thresholds are set and the potential VBG is controlled in accordance with the magnitude relation between the threshold and the sensor output.

In the case where there is a change in Step S23, the operation goes to Step S24, and the potential VBG supplied as a back gate potential is set to V1 which is higher than V0. In other words, the off-state current Ioff of the transistor MT4 is controlled to increase, and the potential VBG is switched so that the current Idata flowing between the memory circuits increases. In the case where there is no change or only a small change in Step S23, Step S22 is continued.

In Step S25, whether or not there is a change in the signal Se output from the sensor unit 60 is determined. The determination of whether or not there is a change in the sensor signal is preferably a structure where a plurality of thresholds are set and the potential VBG is controlled in accordance with the magnitude relation between the threshold and the sensor output.

In the case where there is a change in Step S25, the operation goes to Step S26, and the potential VBG supplied as a back gate potential is set to V2 which is higher than V1. In other words, the off-state current Ioff of the transistor MT4 is controlled to further increase, and the potential VBG is switched so that the current Idata flowing between the memory circuits increases. In the case where there is no change or only a small change in Step S25, Step S24 is continued.

With this structure, a function of varying the amount of current flowing between the memory circuits in accordance with the output of the sensor unit can be achieved. When the sensor unit is a temperature sensor, for example, the following function can be achieved: transmission of information under high temperatures or low temperatures is activated, and transmission of information under room temperature becomes inactive.

FIGS. 6(A) to 6(D) are drawings for describing, by modeling on a human brain, the storage of information in the semiconductor device of one embodiment of the present invention.

Figure 6A:
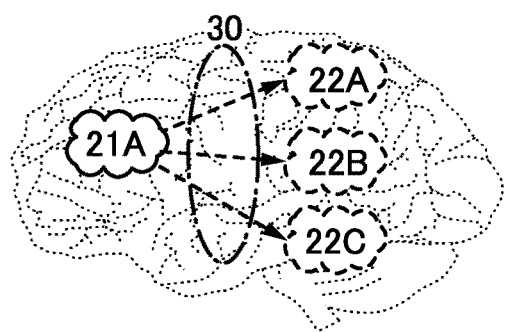
FIG. 6 (A) to (D) Conceptual diagrams illustrating a structure example of a semiconductor device.

FIG. 6(A) illustrates an initial state where information is retained in the memory circuit 21A (indicated by a solid line), transmission of information by the switching circuit 30 is inactive (a state where the amount of current flowing between the memory circuits is small; indicated by dashed arrows), and information is not retained in the memory circuits 22A to 22C (indicated by a dashed line).

Figure 6B:
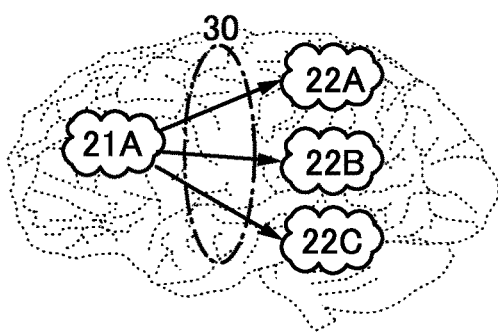

In the semiconductor device of one embodiment of the present invention, the state can be switched into a state where transmission of information by the switching circuit 30 is activated (a state where the amount of current flowing between the memory circuits is large; indicated by solid arrows), in accordance with the signal Se from the sensor unit. Thus, as illustrated in FIG. 6(B), it is possible to make the information retained in the memory circuit 21A be then retained in the memory circuits 22A to 22C (indicated by a solid line).

Figure 6C:
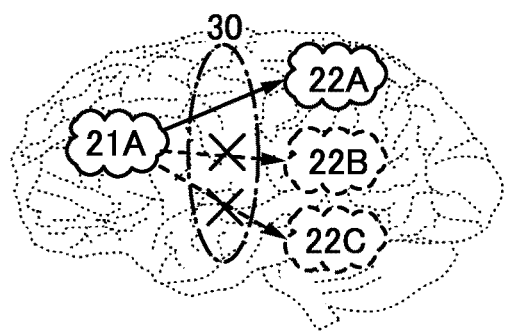

In the semiconductor device of one embodiment of the present invention, the state can be switched such that the information in the memory circuits 22A to 22C is to be lost (such that the retaining term is shortened), in accordance with the signal Se from the sensor unit. Thus, as illustrated in FIG. 6(C), it is possible to switch the state into a state where transmission of information by the switching circuit 31 to the memory circuits 28B and 28C is inactivated and to switch the information retained in the memory circuits 22B and 22C into short-term memory (indicated by a thin dashed line).

Figure 6D:
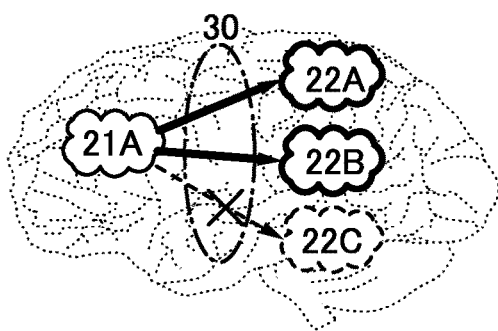

In the semiconductor device of one embodiment of the present invention, it is possible to, in addition to getting the information in the memory circuits 22A to 22C lost (shortening the retaining term), switch to enhance it (to increase the retaining term), in accordance with the signal Se from the sensor unit. Thus, as illustrated in FIG. 6(D), it is possible to switch the state into a state where transmission of information by the switching circuit 30 to the memory circuits 22B and 22C is further activated (a state where the amount of current flowing between the memory circuits is larger; indicated by bold arrows) and a state where transmission of information to the memory circuits 22B and 22C is inactivated, so that the information retained in the memory circuit 22A is switched into long-term memory (indicated by a bold solid line), or the information retained in the memory circuits 22B and 22C is switched into short-term memory.

Combination 1 of Sensor Unit and External Circuit

Figure 7A:
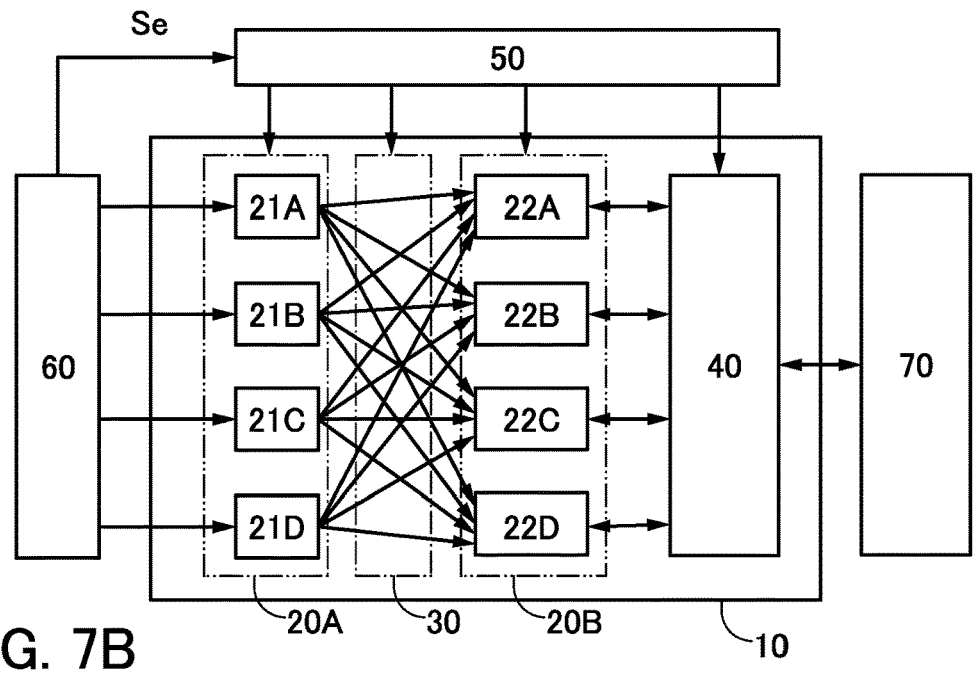
FIGS. 7 (A) and (B) Block diagrams illustrating a structure example of a semiconductor device.

The structure described above can be a structure transmitting/receiving information to/from an external circuit 70 as illustrated in FIG. 7(A). The structure described above can be a structure to which information is input from the sensor unit 60 as illustrated in FIG. 7(A). The external circuit 70 may have a structure that outputs information to a display device, an actuator, or the like.

With the structure in FIG. 7(A), a signal (information) obtained by an external sensor or the like can be processed. For example, information like biological information such as brain waves, a pulse, blood pressure, and body temperature is obtained with a variety of sensors such as a brain wave sensor, a pulse wave sensor, a blood pressure sensor, and a temperature sensor, and the information can be stored. With the use of the obtained information, biological information that irregularly changes should be able to be collectively grasped instantly.

Figure 7B:
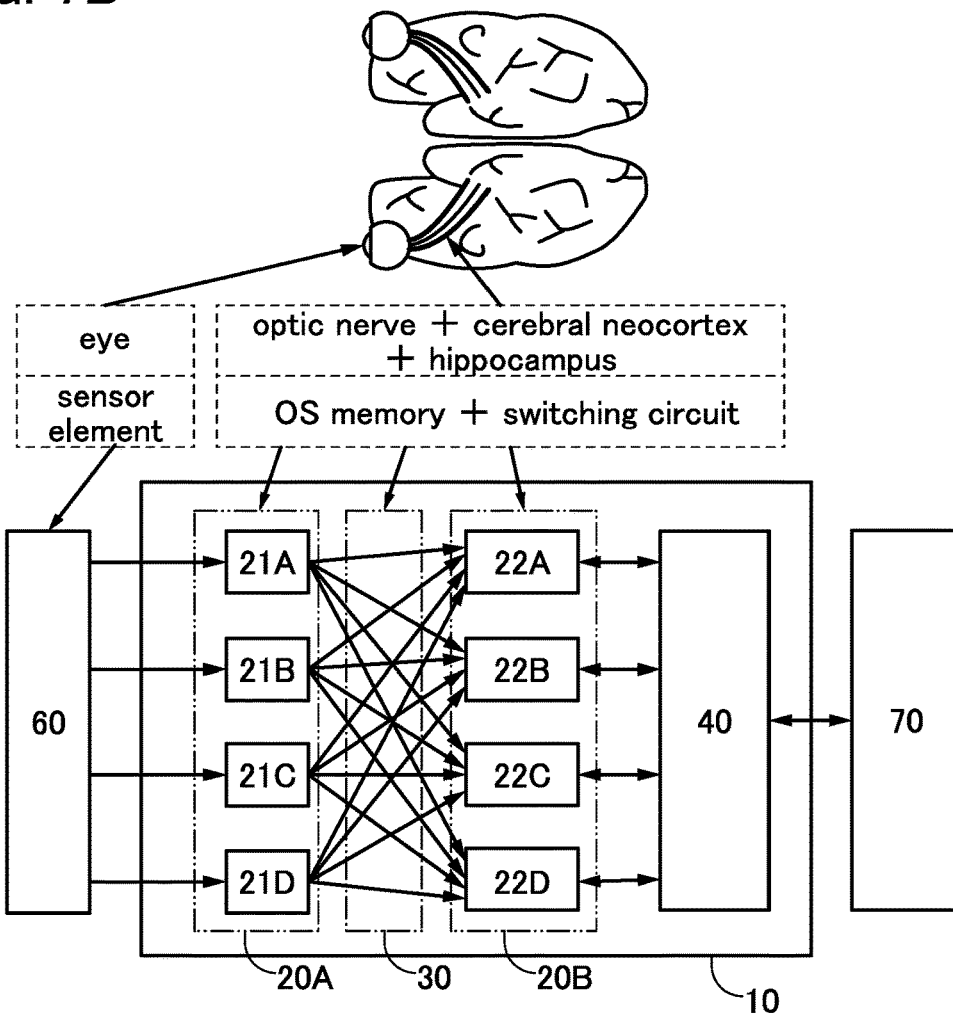

FIG. 7(B) is a schematic diagram for comparing the function that can be achieved by the semiconductor device illustrated in FIG. 7(A) and the function of the periphery of a human brain.

In the sensor unit 60, a sensor element (photoelectric conversion element, for example) corresponds to a human eye. Information output from the photoelectric conversion element is input to the memory unit including OS transistors. The memory unit includes a memory circuit formed using an OS transistor and a switching circuit formed using an OS transistor.

The memory unit 10 is a memory element, and corresponds to a part that governs memory such as the cerebral neocortex or hippocampus. The switching circuit corresponds to a part that performs transmission of information such as the optic nerve or axon. The input/output circuit can be a structure where input/output of information from/to the external circuit is performed based on the information stored in the memory unit 10.

Structure Example 2 of Semiconductor Device

Figure 8:
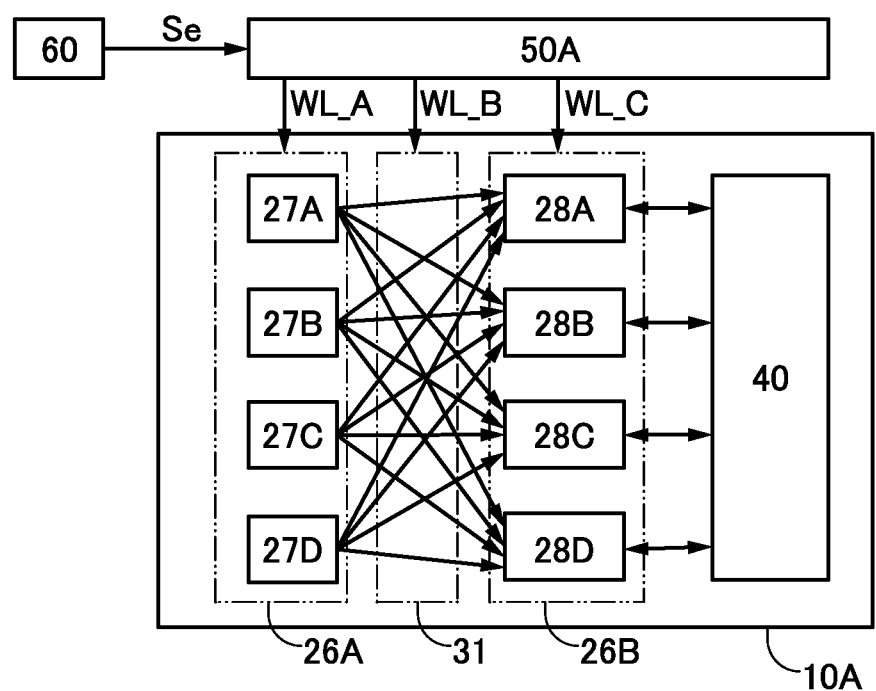
FIG. 8 A block diagram illustrating a structure example of a semiconductor device.

FIG. 8 is an example of a block diagram for describing the structure of a semiconductor device. The semiconductor device shown in FIG. 8 includes a sensor unit 60, a control unit 50A, and a memory unit 10A. The memory unit 10A includes, for example, memory circuits 26A and 26B, a switching circuit 31, and an input/output circuit 40.

Note that although FIG. 8 illustrates one sensor unit 60, one control unit 50A, and one memory unit 10A, a structure provided with a plurality of sensor units 60, control units 50A, and memory units 10A may be employed. Furthermore, without being limited to the structure shown in FIG. 8, a structure provided with a plurality of memory circuits 26A and 26B, switching circuits 31, and input/output circuits 40 may be employed.

The memory circuit 26A includes a plurality of memory circuits (memory circuits 27A to 27D are shown in FIG. 8). The memory circuits 27A to 27D each include a plurality of memory elements. Although not illustrated in the figure, the memory circuits 27A to 27D include a driver circuit for driving the plurality of memory elements. The driver circuit has a function capable of switching a signal waveform of a word signal, in accordance with the control by the control unit 50A. The memory circuits 27A to 27D have a function capable of changing the information storing ability in accordance with a signal Se obtained at the sensor unit 60. Note that information may be read as data in some cases. Note that in a memory circuit, information is stored as a voltage value or a charge amount that corresponds to data.

The memory circuits 27A to 27D include memory elements capable of changing the information storing ability in accordance with the signal waveform of the word signal, for example. The control unit 50A can control, for example, the memory circuit 27A and the memory circuit 27B such that the memory elements in the memory circuit 27A are capable of storing long-term information and the memory elements in the memory circuit 27B are capable of storing short-term information.

The memory circuit 26B includes a plurality of memory circuits (memory circuits 28A to 28D are shown in FIG. 8), similarly to the memory circuit 26A. The memory circuits 28A to 28D each include a plurality of memory elements. Although not illustrated in the figure, the memory circuits 28A to 28D include a driver circuit for driving the plurality of memory elements. The driver circuit has a function capable of switching a signal waveform of a word signal, in accordance with the control by the control unit 50A. The memory circuits 28A to 28D have a function capable of changing the information storing ability in accordance with a signal Se obtained at the sensor unit 60.

The memory circuits 28A to 28D include memory elements capable of changing the information storing ability in accordance with the signal waveform of the word signal, for example. The control unit 50A can control, for example, the memory circuit 28A and the memory circuit 28B such that the memory elements in the memory circuit 28A are capable of storing long-term information and the memory elements in the memory circuit 28B are capable of storing short-term information.

DOSRAM or NOSRAM is preferable as a memory circuit that can be used for the memory circuits 26A and 26B.

Note that in one embodiment of the present invention, a structure in which NOSRAM or DOSRAM is used for circuits included in the memory circuits 26A and 26B is described; however, one embodiment of the present invention is not limited thereto. In the case where the use of nonvolatile memories such as a ReRAM and an MRAM sufficiently reduces power consumption along with the future technological innovation, for example, a structure in which such nonvolatile memories are used for circuits included in the memory circuits 26A and 26B may be employed, depending on circumstances.

The switching circuit 31 has a function capable of controlling electrical connection between the memory circuits 26A and 26B in accordance with control by the control unit 50A. The switching circuit 31 has a function of controlling the amount of current flowing between the memory circuits 27A to 27D and the memory circuits 28A to 28D, for example. In other words, the switching circuit 31 has a function capable of switching transmission of information between the plurality of memory circuits. The switching circuit 31 has a function capable of changing, in accordance with the signal waveform of the word signal, the amount of current flowing between the memory circuits 27A to 27D and the memory circuits 28A to 28D in accordance with the signal Se obtained at the sensor unit 60. The switching circuit 31 is referred to as a reconfigurable circuit (reconfiguration circuit) in some cases.

The switching circuit 31 includes a memory element that controls the amount of current flowing between the memory circuits, and a semiconductor element for allowing current to flow in accordance with information stored in the memory element. The switching circuit 31 has a function capable of changing the information stored in the memory element through control by the control unit 50A of the signal waveform of the word signal. Note that FIG. 8 shows arrows between the memory circuits 26A and 26B as pointing in one direction; however, depending on the flow of information, the arrows may be shown as two-way arrows.

The switching circuit 31 is a programmable device including an OS transistor. Note that in this specification and the drawings, a programmable device including an OS transistor is referred to as an OS-FPGA. Moreover, information stored in a memory element of the OS-FPGA is referred to as configuration data.

An OS-FPGA can have a smaller memory area than an FPGA where a memory element is formed using an SRAM. Thus, adding a context switching function only causes a small increase in area. Moreover, an OS-FPGA can transmit data and parameters at high speed by utilizing the boosting.

Examples of the sensor unit 60 are a variety of sensors such as a brain wave sensor, a pulse wave sensor, a blood pressure sensor, and a temperature sensor for obtaining information like biological information such as brain waves, pulse, blood pressure, and body temperature. Although FIG. 8 illustrates a state where the signal Se is output from one sensor, a structure where signals obtained at a plurality of sensors are input to the control unit 50A may be employed.

The control unit 50A includes arithmetic circuits such as a CPU (central processing unit) and a GPU (graphics processing unit), and memory circuits such an SRAM (static random access memory). The control unit 50A has a function of outputting signals WL_A to WL_C in accordance with the signal Se output from the sensor unit 60. The control unit 50A can perform output in response to input, with the use of arithmetic processing or the like based on an artificial neural network, for example.

The signals WL_A to WL_C are signals (word signals) supplied to a gate electrode of a transistor included in each of the memory circuits 26A and 26B and the switching circuit 31, or signals capable of switching the word signals. Note that FIG. 8 illustrates a state where the signal WL_A is output to the memory circuit 26A; it has a structure where the signal WL_A controls the memory circuits 27A to 27D or memory elements included in the memory circuit 26A with different word signals. Similarly, the memory circuit 26B and the switching circuit 31 can have a structure where different memory circuits are controlled with different word signals.

Note that the control unit 50A can switch control of the signals WL_A to WL_C in accordance with the signal Se output from the sensor unit 60. For example, control of the signals WL_A to WL_C can be switched between the case where the same signal Se is input repetitively and the case where the signal Se with high intensity or low intensity is input.

The input/output circuit 40 is a circuit for controlling input/output of information to/from the memory circuit 26A, the memory circuit 26B, and the switching circuit 31. The input/output circuit 40 may be provided outside the memory unit 10A.

With the structure of the semiconductor device disclosed in this embodiment, the formation and process of long-term memory and the formation and process of short-term memory in a human brain can be achieved by semiconductor devices including an OS transistor. Thus, data can be stored by the function closer to a human brain than a conventional case. In addition, data can be retained with extremely low power. In other words, a brain processor can be driven with extremely low power consumption, similarly to a human brain.

Configuration Example 2 of NOSRAM and DOSRAM

The memory circuits 27A to 27D or 28A to 28D are circuit configurations including an OS transistor. An example of the circuit configuration and operation will be described with reference to FIGS. 9(A) to 9(D) and FIGS. 10(A) to 10(D).

Figure 9A:
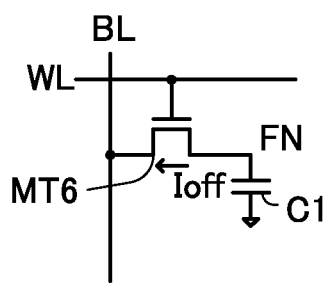
FIG. 9 (A) to (D) A circuit diagram, a waveform chart, a graph, and a flowchart showing a structure example of a semiconductor device.

FIG. 9(A) shows a circuit diagram of a memory element having the circuit configuration of DOSRAM. FIG. 9(A) shows a transistor MT6, a capacitor C1, a word line WL, and a bit line BL.

The transistor MT6 is an OS transistor, which is a three-terminal element including a gate electrode. The transistor MT6 may be a four-terminal element including a back gate electrode. An off-state current of the transistor MT6 is indicated as Ioff in the figure. A node that retains charge, i.e., a node of a wiring to which the transistor MT6 and the capacitor C1 are connected is indicated as a node FN in FIG. 9(A).

The bit line BL has a function of transmitting information (data or data potential) to be written to the memory element. The word line WL has a function of transmitting a signal (word signal) for controlling on/off ratio (corresponding to the length of on-time) of the transistor MT6, in accordance with control by the control unit 50A. The bit line BL and the word line WL are each simply referred to as a wiring in some cases.

The word signal supplied to the word line WL is controlled by the control unit 50A as a potential different between memory elements included in the memory circuits 27A to 27D, for example. A word signal at the time when information is stored in the memory circuit 27A is WL_0, a word signal at the time when information is stored in the memory circuit 26B is WL_1, and a word signal at the time when information is stored in the memory circuit 27C is WL_2, for example. The signals WL_0 to WL_2 can be expressed as signals with different on-time T0 to T2 as shown in FIG. 9(B).

Figure 9B:
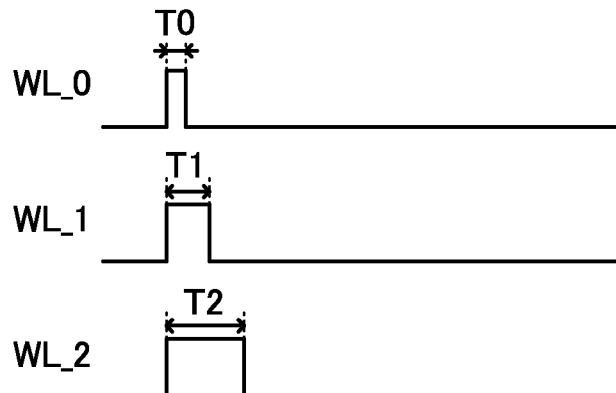
Figure 9C:
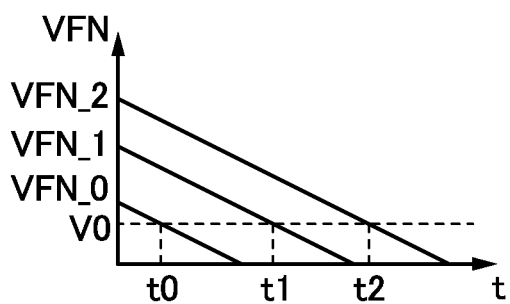

A potential that is retained at the note FN changes in accordance with the on-time T0 to T2 shown in FIG. 9(B). For example, in the case where the potential of the node FN is VFN_0 for the on-time being T0, the potential of the node FN is VFN_1 for the on-time being T1, and the potential of the node FN is VFN_2 for the on-time being T2, the magnitude relationship is as shown in the graph in FIG. 9(C). The potential of the note FN changes over time, and there arise a difference of time taken to reach a given potential (V0) (see time t0 to t2 in FIG. 9(C)). That is, the shorter the on-time is, the more likely the charge retained at the node FN is to change in a short time, and the longer the on-time is, the less likely the charge retained at the node FN is to change. Consequently, information retention terms can be varied between memory circuits.

The above configuration enables the memory circuits 27A to 27D or 28A to 28D to have functions of storing information with different memory abilities in accordance with the signal Se obtained at the sensor unit 60.

Figure 9D:
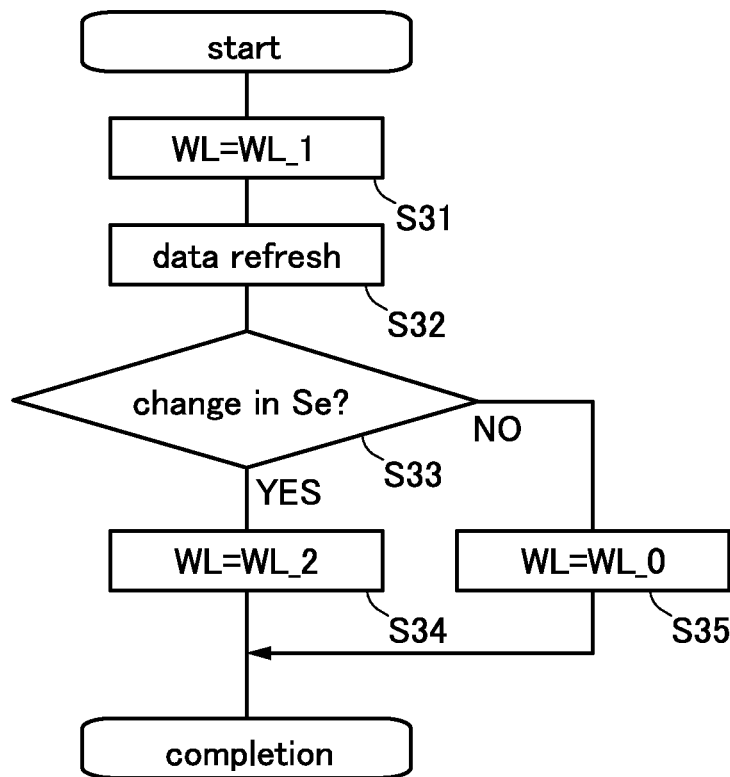

FIG. 9(D) shows a flowchart for describing the operation of the above-described DOSRAM.

In Step S31, information is stored in the memory circuit with the word signal supplied to the word line WL being WL_1.

In Step S32, periodic refresh of information (data refresh) is performed with the word signal supplied to the word line WL being WL_1. Note that in the case where the off-state current is sufficiently low, refresh of information may be omitted.

In Step S33, whether or not there is a change in the signal Se output from the sensor unit 60 is determined. The determination of whether or not there is a change in the sensor signal is preferably a structure where a plurality of thresholds are set and the on-time of a word signal is controlled in accordance with the magnitude relation between the threshold and the sensor output.

In the case where there is a change in Step S33, the operation goes to Step S34, and information is stored in the memory circuit as the word signal WL_2 having a longer on-time. In other words, the word signal is switched so that information retention time in the memory circuit is increased.

In the case where there is no change or only a small change in Step S33, the operation goes to Step S35, and information is stored in the memory circuit with the word signal supplied to the word line WL being WL_0 having a short on-time. In other words, the word line is switched so that the information retention time in the memory circuit is decreased.

With this structure, a function of storing information with different memory abilities in accordance with the output of the sensor unit can be achieved. When the sensor unit is a temperature sensor, for example, the following function can be achieved: information storage under high temperatures or low temperatures is stored for a long period, and information storage under room temperature is lost after a certain period.

Figure 10A:
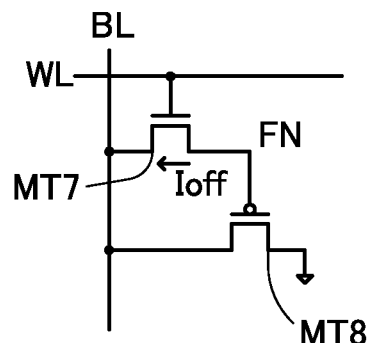
FIG. 10 (A) to (D) A circuit diagram, a waveform chart, a graph, and a flowchart illustrating a structure example of a semiconductor device.

FIG. 10(A) shows a circuit diagram of a memory element having the circuit configuration of NOSRAM. FIG. 10(A) shows a transistor MT7, a transistor MT8, a word line WL, and a bit line BL.

The transistor MT7 is an OS transistor, which is a three-terminal element including a gate electrode. The transistor MT7 may be a four-terminal element including a back gate electrode. An off-state current of the transistor MT7 is indicated as Ioff in the figure. A node that retains charge, i.e., a node of a wiring to which the transistor MT7 and the gate of the transistor MT8 are connected is indicated as a node FN in FIG. 10(A).

Note that although the transistor MT8 is illustrated as a p-channel transistor in FIG. 10(A), the transistor MT8 may be an n-channel transistor. Although FIG. 10(A) shows a 2T-type provided with two transistors, it can be a 2T1C-type including a capacitor, or a 3T-type combined with another transistor. Note that the capacitor connected to the node FN can be omitted when parasitic capacitance such as the gate capacitance of the transistor MT3 is increased.

The word signal supplied to the word line WL is controlled by the control unit 50A as a potential different between memory elements included in the memory circuits 27A to 27D, for example. A word signal at the time when information is stored in the memory circuit 27A is WL_0, a word signal at the time when information is stored in the memory circuit 27B is WL_1, and a word signal at the time when information is stored in the memory circuit 27C is WL_2, for example. The signals WL_0 to WL_2 can be expressed as signals with different on-time T0 to T2 as shown in FIG. 10(B).

Figure 10B:
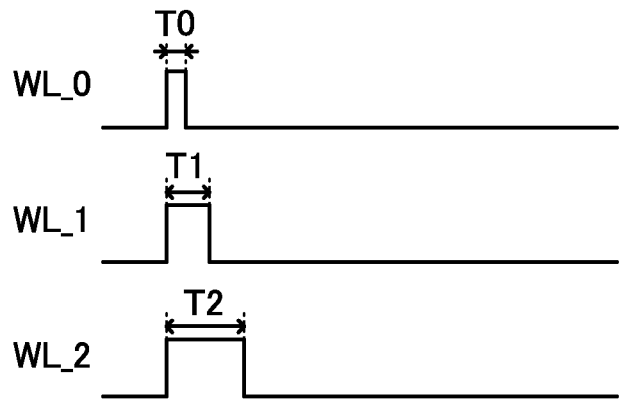
Figure 10C:
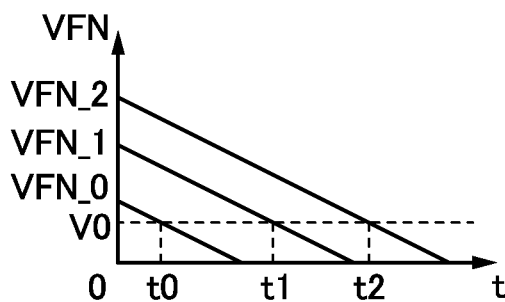

A potential that is retained at the note FN changes in accordance with the on-time T0 to T2 shown in FIG. 10(B). For example, in the case where the potential of the node FN is VFN_0 for the on-time being T0, the potential of the node FN is VFN_1 for the on-time being T1, and the potential of the node FN is VFN_2 for the on-time being T2, the magnitude relationship is as shown in the graph in FIG. 10(C). The potential of the note FN changes over time, and there arise a difference of time taken to reach a given potential (V0) (see time t0 to t2 in FIG. 10(C)). That is, the shorter the on-time is, the more likely the charge retained at the node FN is to change in a short time, and the longer the on-time is, the less likely the charge retained at the node FN is to change. Consequently, information retention terms can be varied between memory circuits.

The above configuration enables the memory circuits 27A to 27D or 28A to 28D to have functions of storing information with different memory abilities in accordance with the signal Se obtained at the sensor unit 60.

Figure 10D:
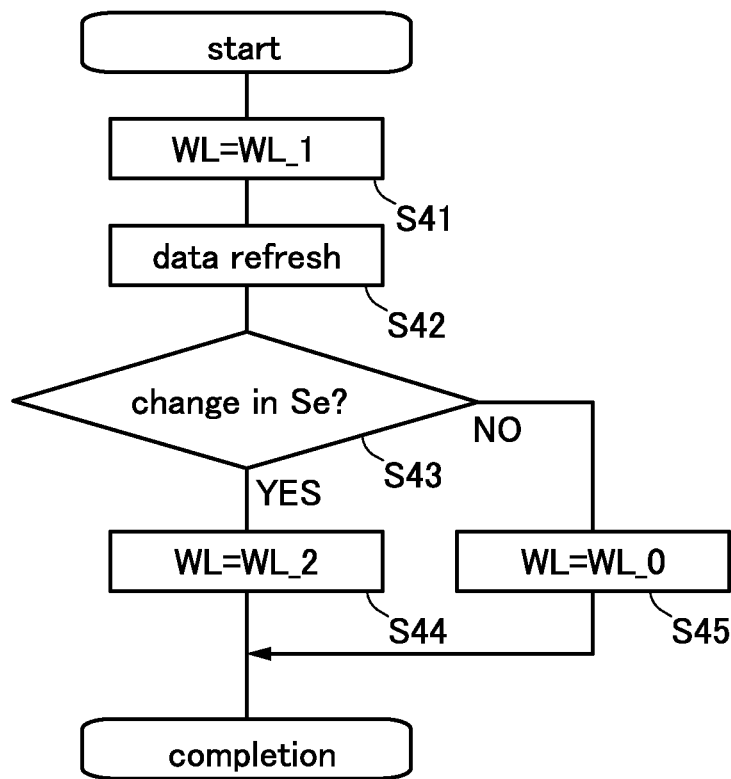

FIG. 10(D) shows a flowchart for describing the operation of the above-described NOSRAM.

In Step S41, information is stored in the memory circuit with the word signal supplied to the word line WL being WL_1.

In Step S42, periodic refresh of information (data refresh) is performed with the word signal supplied to the word line WL being WL_1. Note that in the case where the off-state current is sufficiently low, refresh of information may be omitted.

In Step S43, whether or not there is a change in the signal Se output from the sensor unit is determined. The determination of whether or not there is a change in the sensor signal is preferably a structure where a plurality of thresholds are set and the on-time of a word signal is controlled in accordance with the magnitude relation between the threshold and the sensor output.

In the case where there is a change in Step S43, the operation goes to Step S44, and information is stored in the memory circuit with the word signal supplied to the word line WL being WL_2 having a longer on-time. In other words, the word signal is switched so that information retention time in the memory circuit is increased.

In the case where there is no change or only a small change in Step S43, the operation goes to Step S45, and information is stored in the memory circuit with the word signal supplied to the word line WL being WL_0 having a short on-time. In other words, the word line is switched so that the information retention time in the memory circuit is decreased.

With this structure, a function of storing information with different memory abilities in accordance with the output of the sensor unit can be achieved. When the sensor unit is a temperature sensor, for example, the following function can be achieved: information storage under high temperatures or low temperatures is stored for a long period, and information storage under room temperature is lost after a certain period.

Configuration Example 2 of Switching Circuit

The switching circuit 31 is a circuit configuration with an OS transistor. An example of the circuit configuration and operation will be described with reference to FIGS. 11(A) to 11(C), FIG. 12, and FIGS. 13(A) to 13(D).

Figure 11A:
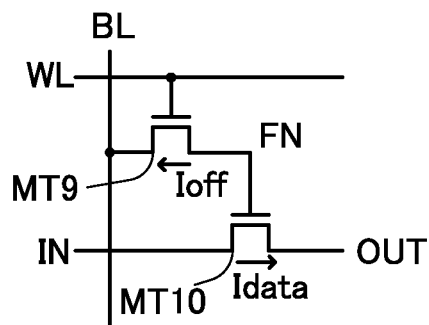
FIG. 11 (A) to (C) A circuit diagram, a waveform chart, a graph, and a flowchart showing a structure example of a semiconductor device.

FIG. 11(A) shows a circuit diagram of a memory element having the circuit configuration of the switching circuit 31 placed between a pair of memory circuits. FIG. 11(A) shows a transistor MT9, a transistor MT10, a word line WL, a bit line BL, an input terminal IN, and an output terminal OUT.

The transistor MT9 is an OS transistor, which is a three-terminal element including a gate electrode. The transistor MT9 may be a four-terminal element including a back gate electrode. An off-state current of the transistor MT9 is indicated as Ioff in the figure. A node that retains charge, i.e., a node of a wiring to which the transistor MT9 and the gate of the transistor MT10 are connected is indicated as a node FN in FIG. 11(A).

The transistor MT10 is an Si transistor or an OS transistor. A current flowing through the transistor MT10 in accordance with the potential of the node FN, i.e., a current flowing between the input terminal IN and the output terminal OUT is indicated as Idata in the figure.

Note that in FIG. 11(A) the transistor MT10 may be a p-channel transistor or an n-channel transistor. Although FIG. 11(A) shows a 2T-type provided with two transistors, it can be a 2T1C-type including a capacitor, or a 3T-type combined with another transistor. Note that the capacitor connected to the node FN can be omitted when parasitic capacitance such as the gate capacitance of the transistor MT10 is increased.

The word signal supplied to the word line WL is controlled by the control unit 50A as a potential different between switching circuits each provided between any one of the memory circuits 27A to 27D and any one of the memory circuits 28A to 28D, for example. A word signal for the transistor MT9 included in the switching circuit provided between the memory circuit 27A and the memory circuit 28A is WL_0, a word signal for the transistor MT9 included in the switching circuit provided between the memory circuit 27B and the memory circuit 28B is WL_1, and a word signal for the transistor MT9 included in the switching circuit provided between the memory circuit 27C and the memory circuit 28C is WL_2, for example. The signals WL_0 to WL_2 can be expressed as signals with different on-time T0 to T2 as shown in FIG. 11(B).

Figure 11B:
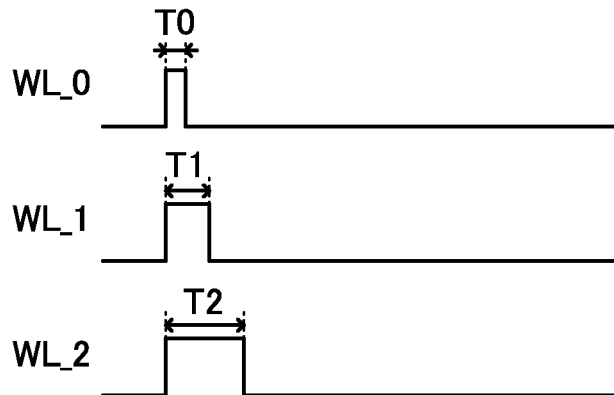

A potential that is retained at the note FN changes in accordance with the on-time T0 to T2 shown in FIG. 11(B). The longer the on-time is, the more likely the charge retained at the node FN is to change, and the shorter the on-time is, the less likely the charge retained at the node FN is to change. At this time, when an L-level potential is retained at the node FN, there arises a difference in a potential ($V_{FN}$) of the node FN in accordance with the length of the on-time. Thus, there arises a difference in the current Idata flowing in accordance with the potential of the node FN. As a result, the amount of current flowing between the memory circuits can be varied between the memory circuits.

With this structure, the switching circuit provided between wirings between any one of the memory circuits 27A to 27D and any one of the memory circuits 28A to 28D achieves a function of causing a difference in the amount of current flowing between the memory circuits, in accordance with the signal Se obtained at the sensor unit 60.

Figure 11C:
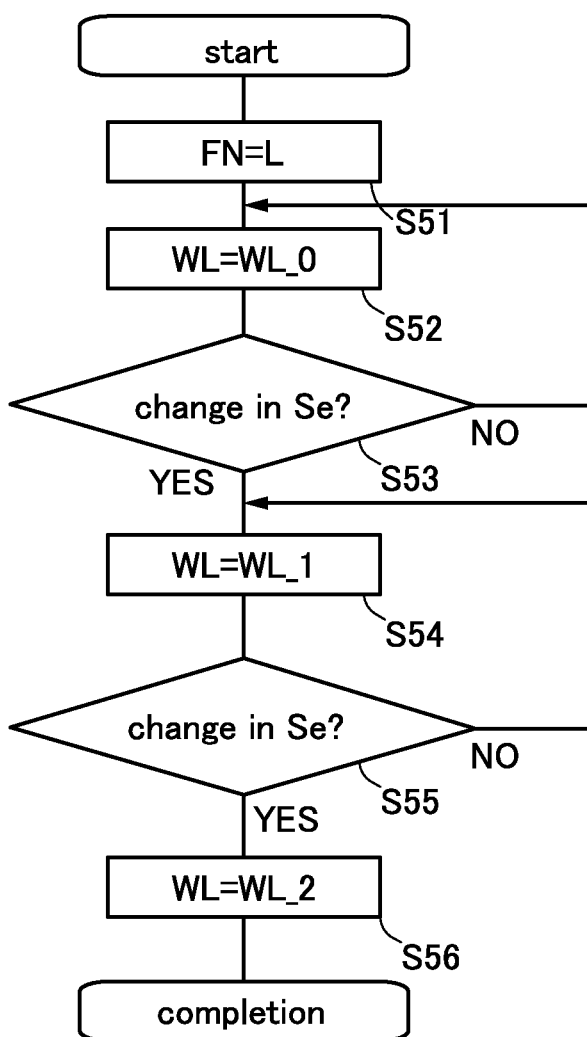

FIG. 11(C) shows a flowchart for describing the operation of the above-described switching circuit.

In Step S51, the node FN is set at an L level, that is, data with which the current Idata does not flow. The bit line BL is set at an H level.

In Step 52, the word signal to be supplied to the word line WL is WL_O, so that a change in the potential retained at the node FN is decreased.

In Step S53, whether or not there is a change in the signal Se output from the sensor unit 60 is determined. The determination of whether or not there is a change in the sensor signal is preferably a structure where a plurality of thresholds are set and the on-time of the word signal is controlled in accordance with the magnitude relation between the threshold and the sensor output.

In the case where there is a change in Step S53, the operation goes to Step S54, and the word signal supplied to the word line WL is WL_1. In other words, the change in the potential retained at the node FN is controlled to increase, and the on-time of the word signal is controlled so that the current Idata flowing between the memory circuits increases. In the case where there is no change or only a small change in Step S53, Step S52 is continued.

In Step S55, whether or not there is a change in the signal Se output from the sensor unit 60 is determined. The determination of whether or not there is a change in the sensor signal is preferably a structure where a plurality of thresholds are set and the on-time of the word signal is controlled in accordance with the magnitude relation between the threshold and the sensor output.

In the case where there is a change in Step S55, the operation goes to Step S56, and the word signal is made WL_2. In other words, the change in the potential retained at the node FN is controlled to further increase, and the on-time of the word signal is controlled so that the current Idata flowing between the memory circuits further increases. In the case where there is no change or only a small change in Step S55, Step S54 is continued.

Figure 12:
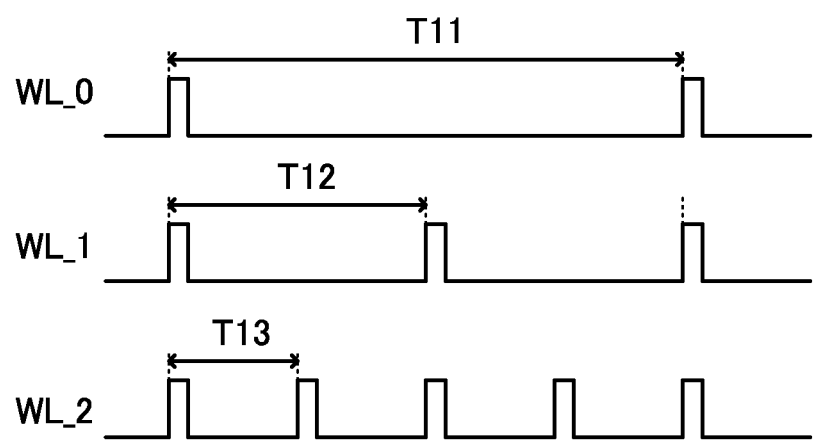
FIG. 12 A waveform chart showing a structure example of a semiconductor device.

Note that in FIGS. 11(A) to 11(C), the structure where the on-time of a word signal is controlled is shown as an example; however, other structures may also be employed. For example, a structure in which a refresh rate of the word signal is changed as illustrated in FIG. 12 may be employed. Taking the example shown in FIG. 12 for description, the frequency of a signal supplied as the word signal is lowered in the case where the current Idata is to be decreased. That is, a structure where the signal is set at an H level once every term T11 as with the signal WL_0 in FIG. 12 is employed. The frequency of a signal supplied as the word signal is raised in the case where the current Idata is to be increased. That is, a structure where the signal is set at an H level once every term T12 as with the signal WL_1 in FIG. 12 is employed. The frequency of a signal supplied as the word signal is further raised in the case where the current Idata is to be increased further. That is, a structure where the signal is set at an H level once every term T13 as with the signal WL_2 in FIG. 12 is employed.

With this structure, a function of varying the amount of current flowing between the memory circuits in accordance with the output of the sensor unit can be achieved. When the sensor unit is a temperature sensor, for example, the following function can be achieved: transmission of information under high temperatures or low temperatures is activated, and transmission of information under room temperature becomes inactive.

FIGS. 13(A) to 13(D) are drawings for describing, by modeling on a human brain, the storage of information in the semiconductor device of one embodiment of the present invention.

Figure 13A:
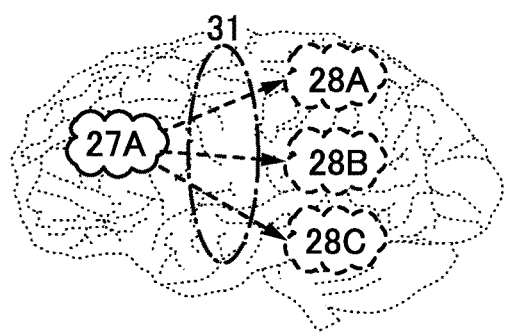
FIG. 13 (A) to (D) Conceptual diagrams illustrating a structure example of a semiconductor device.

FIG. 13(A) illustrates an initial state where information is retained in the memory circuit 27A (indicated by a solid line), transmission of information by the switching circuit 31 is inactive (a state where the amount of current flowing between the memory circuits is small; indicated by dashed arrows), and information is not retained in the memory circuits 28A to 28C (indicated by a dashed line).

Figure 13B:
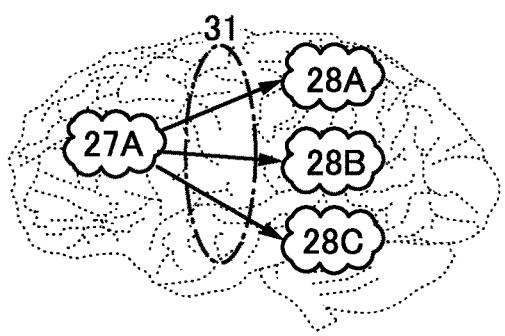

In the semiconductor device of one embodiment of the present invention, the state can be switched into a state where transmission of information by the switching circuit 31 is activated (a state where the amount of current flowing between the memory circuits is large; indicated by solid arrows), in accordance with the signal Se from the sensor unit. Thus, as illustrated in FIG. 13(B), it is possible to make the information retained in the memory circuit 27A be then retained in the memory circuits 28A to 28C (indicated by a solid line).

Figure 13C:
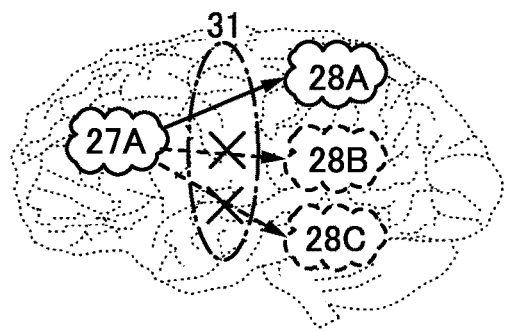

In the semiconductor device of one embodiment of the present invention, the state can be switched such that the information in the memory circuits 28A to 28C is to be lost (such that the retaining term is shortened), in accordance with the signal Se from the sensor unit. Thus, as illustrated in FIG. 13(C), it is possible to switch the state into a state where transmission of information by the switching circuit 31 to the memory circuits 28B and 28C is inactivated and to switch the information retained in the memory circuits 28B and 28C into short-term memory (indicated by a thin dashed line).

Figure 13D:
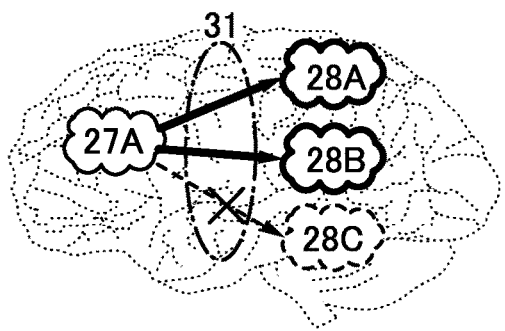

In the semiconductor device of one embodiment of the present invention, it is possible to, in addition to getting the information in the memory circuits 28A to 28C lost (shortening the retaining term), switch to enhance it (to increase the retaining term), in accordance with the signal Se from the sensor unit. Thus, as illustrated in FIG. 13(D), it is possible to switch the state into a state where transmission of information by the switching circuit 31 to the memory circuits 28B and 28C is further activated (a state where the amount of current flowing between the memory circuits is larger; indicated by bold arrows) and a state where transmission of information to the memory circuits 28B and 28C is inactivated, so that the information retained in the memory circuit 28A is switched into long-term memory (indicated by a bold solid line) or the information retained in the memory circuits 28B and 28C are switched into short-term memory.

Combination 2 of Sensor Unit and External Circuit

Figure 14A:
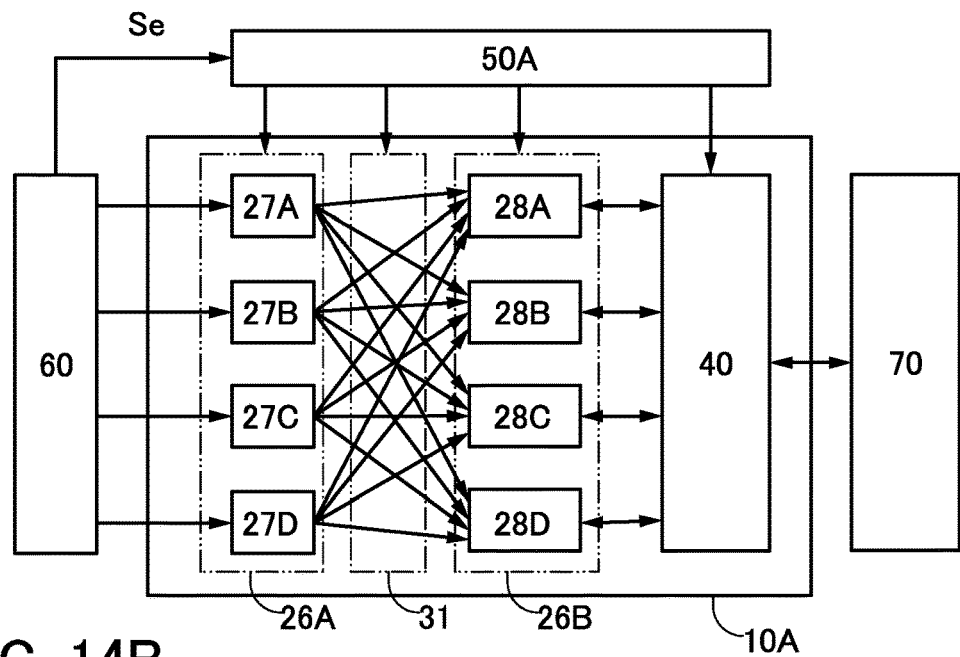
FIGS. 14 (A) and (B) Block diagrams illustrating a structure example of a semiconductor device.

The structure described above can be a structure transmitting/receiving information to/from an external circuit 70 as illustrated in FIG. 14(A). The structure described above can be a structure to which information is input from the sensor unit 60 as illustrated in FIG. 14(A). The external circuit 70 may have a structure that outputs information to a display device, an actuator, or the like.

With the structure in FIG. 14(A), a signal (information) obtained by an external sensor or the like can be processed. For example, information like biological information such as brain waves, a pulse, blood pressure, and body temperature is obtained with a variety of sensors such as a brain wave sensor, a pulse wave sensor, a blood pressure sensor, and a temperature sensor, and the information can be stored. With the use of the obtained information, biological information that irregularly changes should be able to be collectively grasped instantly.

Figure 14B:
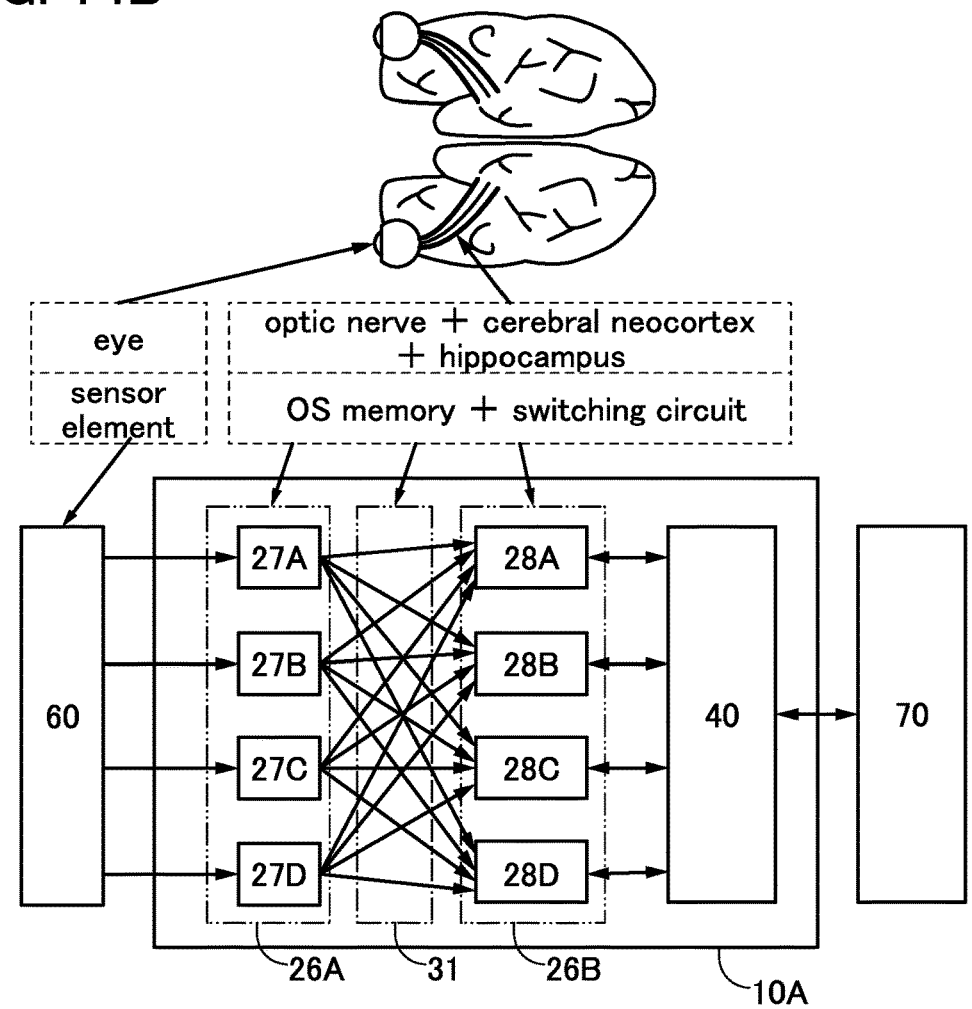

FIG. 14(B) is a schematic diagram for comparing the function that can be achieved by the semiconductor device illustrated in FIG. 14(A) and the function of the periphery of a human brain.

In the sensor unit 60, a sensor element (photoelectric conversion element, for example) corresponds to a human eye. Information output from the photoelectric conversion element is input to the memory unit including OS transistors. The memory unit includes a memory circuit formed using an OS transistor and a switching circuit formed using an OS transistor.

The memory unit 10 is a memory element, and corresponds to a part that governs memory such as the cerebral neocortex or hippocampus. The switching circuit corresponds to a part that performs transmission of information such as the optic nerve or axon. The input/output circuit 40 can be a structure where input/output of information from/to the external circuit is performed based on the information stored in the memory unit 10.

Application Example of Semiconductor Device

Application examples of an electronic device in which the semiconductor device described in the above embodiment can be used will be described with reference to FIGS. 15(A) to 15(D). One embodiment of the present invention can be used in portable electronic devices, e.g., information terminals such as a smartphone and a notebook personal computer.

Figure 15A:
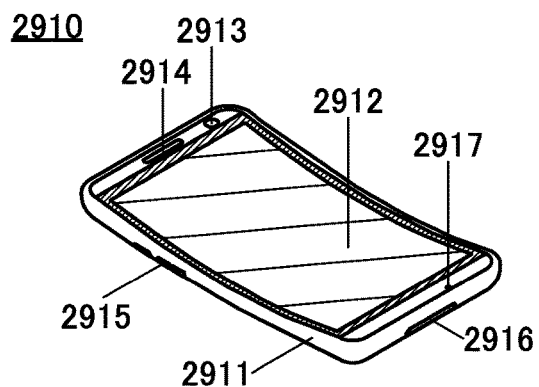
FIG. 15 (A) to (D) Drawings illustrating application examples of a semiconductor device.

A portable information terminal 2910 illustrated in FIG. 15(A) includes a housing 2911, a display portion 2912, a microphone 2917, a speaker portion 2914, a camera 2913, an external connection portion 2916, an operation switch 2915, and the like. A touch screen and a display panel formed using flexible substrates are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, an e-book reader, or the like.

Note that one embodiment of the present invention can be used not only in a portable information terminal but also in autonomous moving vehicles such as an automobile and a robot.

Figure 15B:
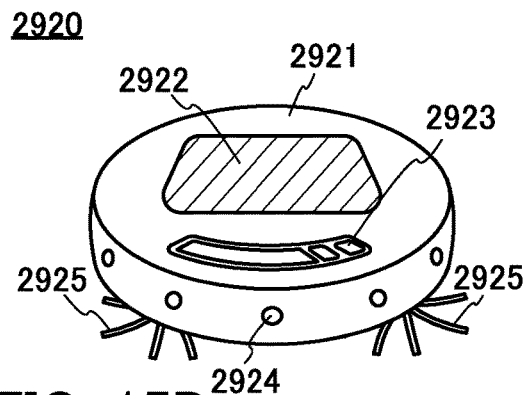

A cleaning robot 2920 illustrated in FIG. 15(B) includes a housing 2921, a display portion 2922, an operation button 2923, a plurality of cameras 2924 placed on the side surface, brushes 2925, and the like. Although not illustrated, the bottom surface of the cleaning robot 2920 is provided with a tire, an inlet, and the like. The cleaning robot 2920 further includes various sensors such as an infrared sensor, an ultrasonic sensor, an acceleration sensor, a piezoelectric sensor, an optical sensor, and a gyroscope sensor. The cleaning robot 2920 has a wireless communication means.

The cleaning robot 2920 can determine whether there is an obstacle such as a wall, furniture, or a step by analyzing images taken by the cameras 2924. When it detects an object that is likely to be caught in the brushes 2925, such as a wire, by image analysis, the rotation of the brushes 5103 can be stopped.

A display 5101 can display the remaining capacity of a battery, the amount of collected dust, and the like. The display portion 2922 may display the route the cleaning robot 2920 has taken.

Figure 15C:
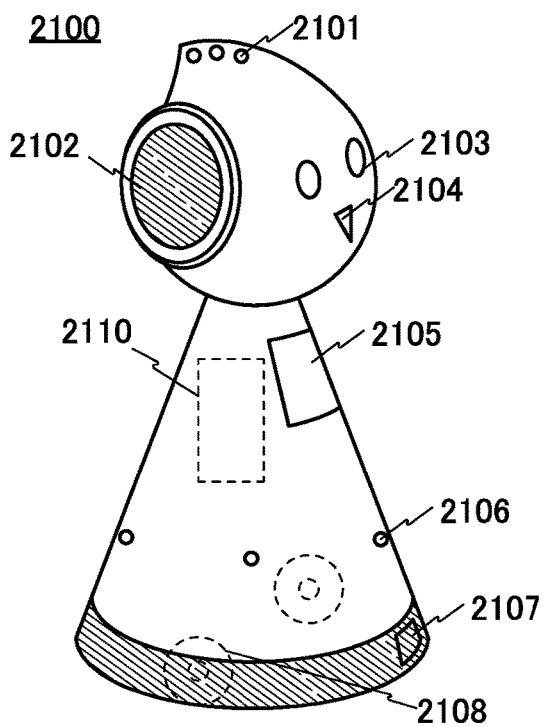

A robot 2100 illustrated in FIG. 15(C) includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The above semiconductor devices can be used for the arithmetic device 2110, the illuminance sensor 2101, the upper camera 2103, the display 2105, the lower camera 2106, the obstacle sensor 2107, and the like of the robot 2100.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107.

Figure 15D:
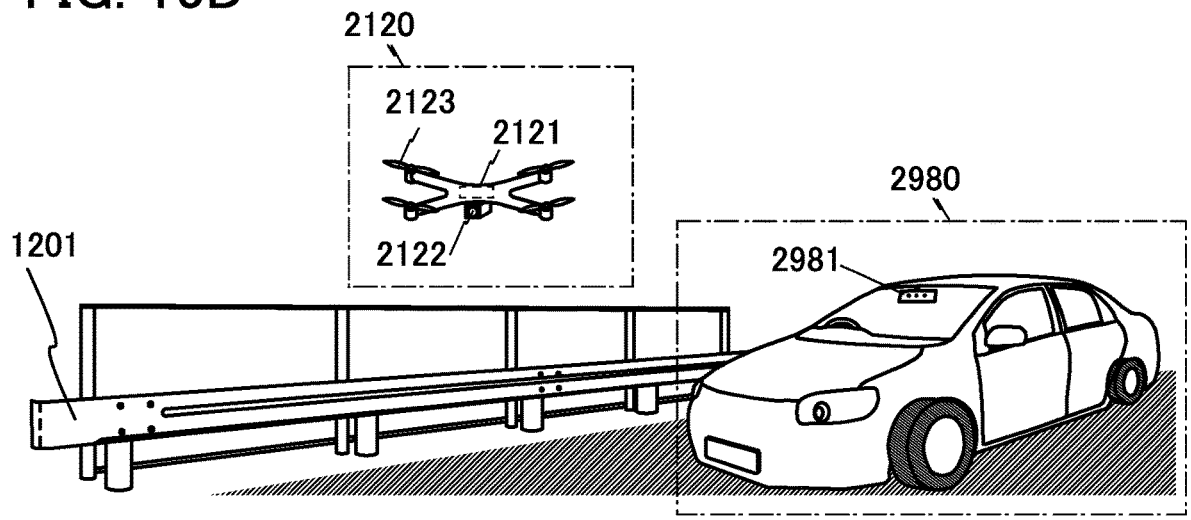

A flying object 2120 illustrated in FIG. 15(D) includes an arithmetic device 2121, a propeller 2123, and a camera 2122 and has a function of flying autonomously.

The above semiconductor device can be used for the arithmetic device 2121 and the camera 2122 of the flying object 2120.

FIG. 15(D) is an external view illustrating an example of an automobile. An automobile 2980 includes a camera 2981 and the like. The automobile 2980 also includes various sensors and the like such as an infrared radar, a millimeter wave radar, and a laser radar. The automobile 2980 judges traffic conditions therearound such as the presence of a guardrail 1201 or a pedestrian by analyzing an image taken by the camera 2981, and thus can perform autonomous driving.

Structure Example of OS Transistor

Figure 16:
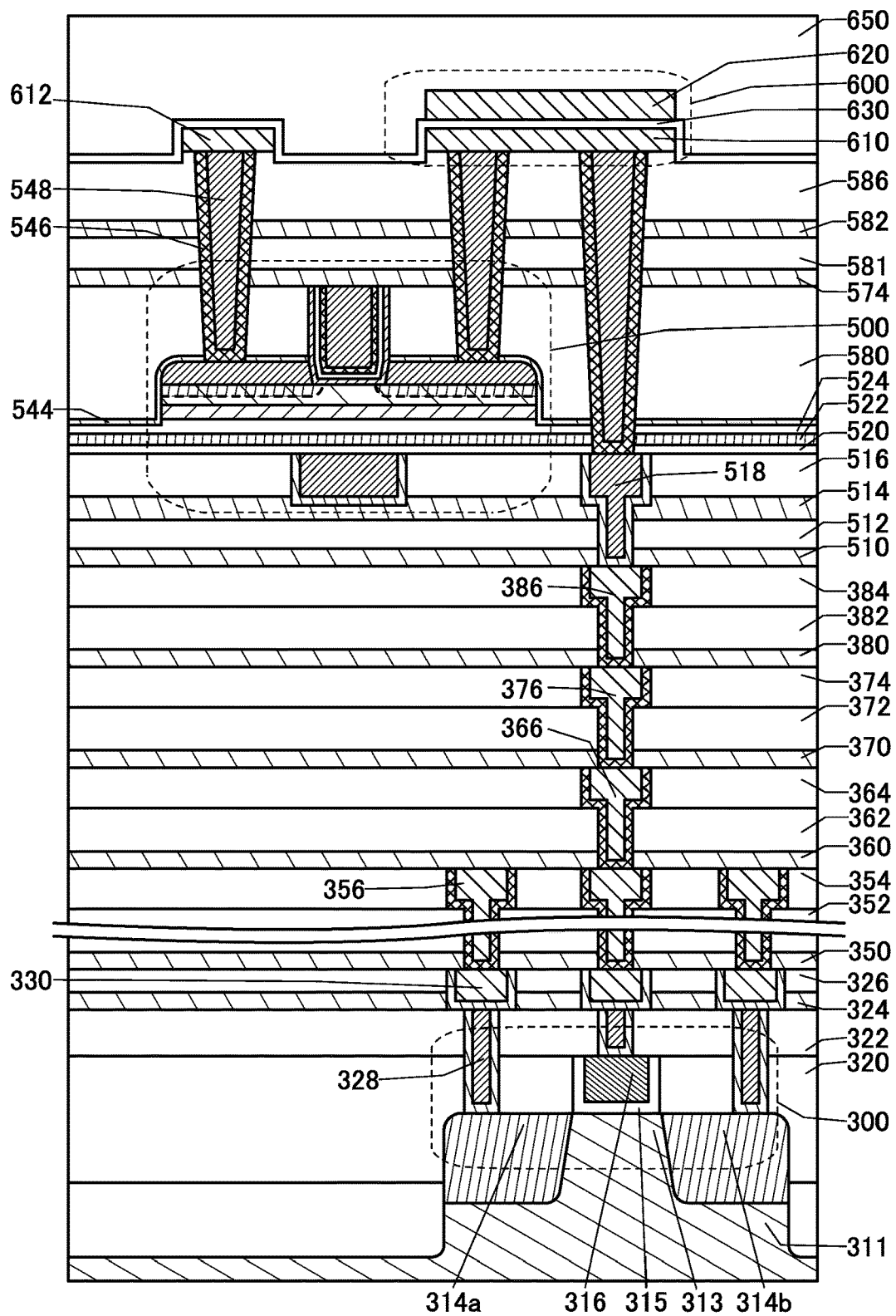
FIG. 16 A cross-sectional view illustrating a structure example of a semiconductor device.
Figure 18A:
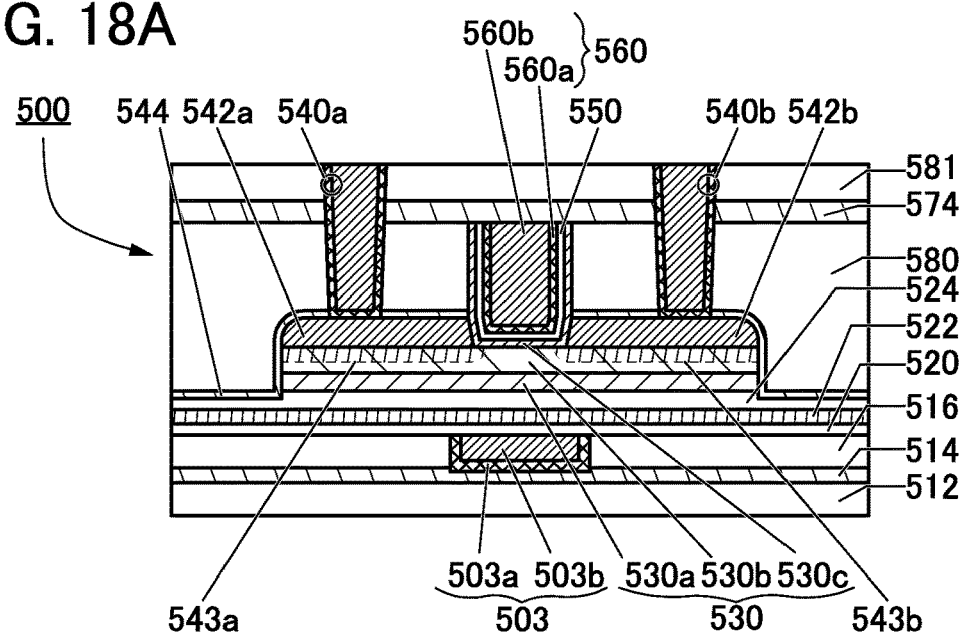
FIG. 18 (A) to (C) Cross-sectional views illustrating a structure example of a transistor.
Figure 18B:
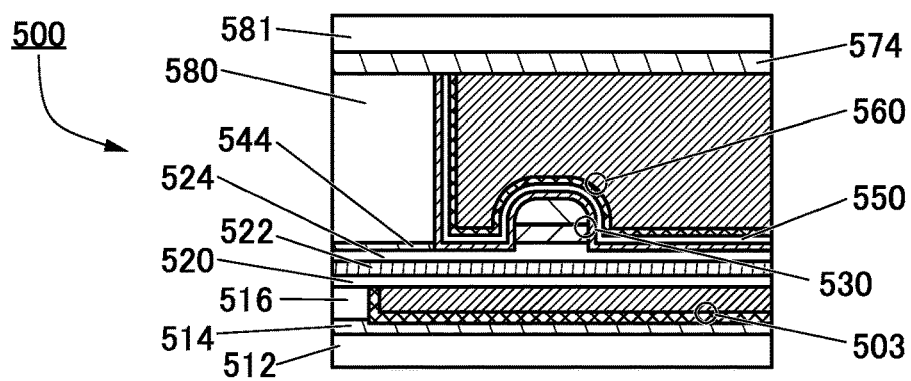
Figure 18C:
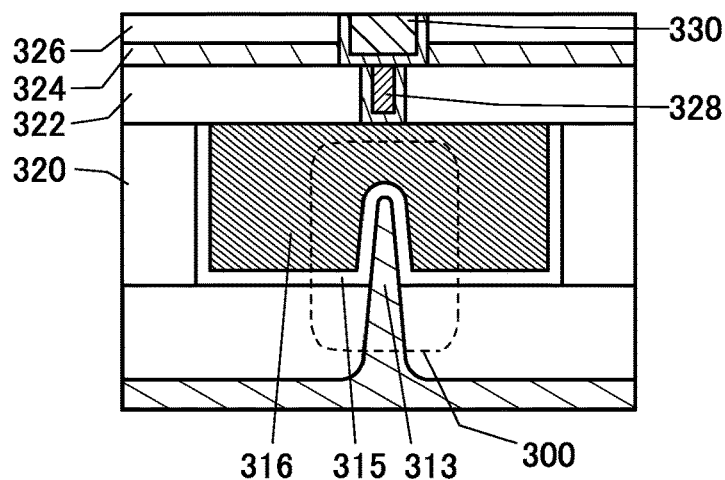

A semiconductor device illustrated in FIG. 16 includes a transistor 300, a transistor 500, and a capacitor 600. FIG. 18(A) is a cross-sectional view of the transistor 500 in the channel length direction, FIG. 18(B) is a cross-sectional view of the transistor 500 in the channel width direction, and FIG. 18(C) is a cross-sectional view of the transistor 300 in the channel width direction.

The transistor 500 is a transistor including a metal oxide in its channel formation region (an OS transistor). Since the off-state current of the transistor 500 is low, the use of the transistor 500 as an OS transistor included in a semiconductor device enables long-term retention of written data. In other words, power consumption of the semiconductor device can be reduced because the semiconductor device has a low frequency of refresh operation or requires no refresh operation.

The semiconductor device described in this embodiment includes the transistor 300, the transistor 500, and the capacitor 600 as illustrated in FIG. 16. The transistor 500 is provided above the transistor 300, and the capacitor 600 is provided above the transistor 300 and the transistor 500.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region. Note that the transistor 300 can be used, for example, as the transistor in the above embodiment.

In the transistor 300, the top surface and the side surface in the channel width direction of the semiconductor region 313 are covered with the conductor 316 with the insulator 315 therebetween, as illustrated in FIG. 18(C). Such a Fin-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 17:
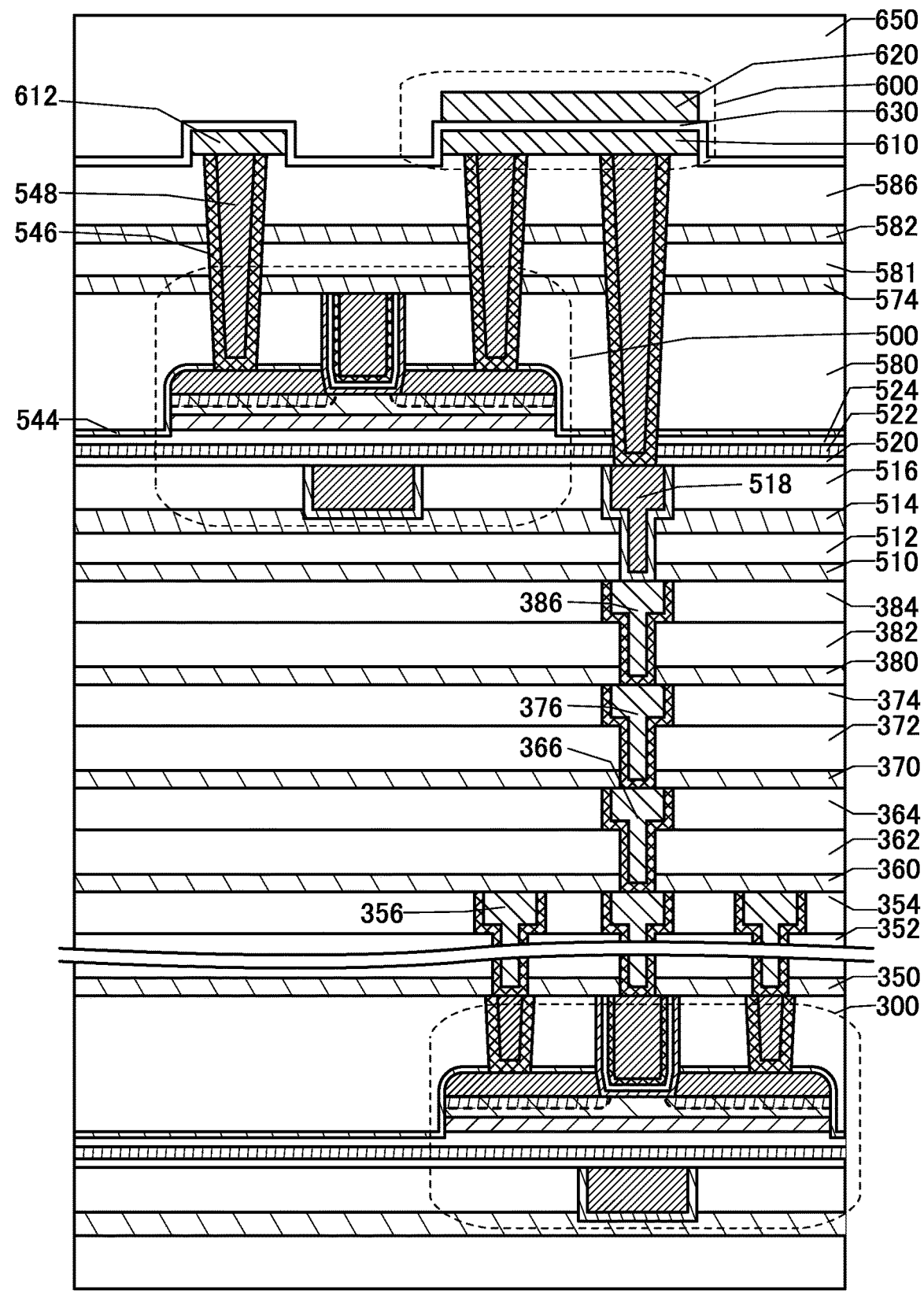
FIG. 17 A cross-sectional view illustrating a structure example of a semiconductor device.

Note that the transistor 300 illustrated in FIG. 16 is just an example and is not limited to having the structure shown therein; an appropriate transistor can be used in accordance with a circuit configuration or a driving method. In the case where all the transistors included in the semiconductor device are the OS transistors and have the same conductivity, for example, the transistor 300 has a structure similar to that of the transistor 500 including an oxide semiconductor as illustrated in FIG. 17. Note that the details of the transistor 500 will be described later.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided under the insulator 322. For example, the top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 500 is provided.

For the film having a barrier property against hydrogen, silicon nitride formed by a CVD method can be used, for example. The diffusion of hydrogen to a semiconductor element including an oxide semiconductor, such as the transistor 500, may result in degradation of the characteristics of the semiconductor element. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less that of the insulator 324. The use of a material having a low permittivity for an interlayer film can reduce the parasitic capacitance between wirings.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Furthermore, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 16, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be formed using a material similar to those for the conductor 328 and the conductor 330.

For example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening of the insulator 350 having a barrier property against hydrogen. With this structure, the transistor 300 and the transistor 500 can be separated by the barrier layer, so that the diffusion of hydrogen from the transistor 300 to the transistor 500 can be inhibited.

Note that as the conductor having a barrier property against hydrogen, tantalum nitride can be used, for example. Stacking tantalum nitride and tungsten having high conductivity can inhibit the diffusion of hydrogen from the transistor 300 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 16, an insulator 360, an insulator 362, and an insulator 364 are stacked in this order. Moreover, a conductor 366 is formed in the insulator 360, the insulator 362, and the insulator 364. The conductor 366 has a function of a plug or a wiring. Note that the conductor 366 can be formed using a material similar to those for the conductor 328 and the conductor 330.

For example, the insulator 360 is preferably formed using an insulator having a barrier property against hydrogen, like the insulator 324. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 500 can be separated by the barrier layer, so that the diffusion of hydrogen from the transistor 300 to the transistor 500 can be inhibited.

A wiring layer may be provided over the insulator 364 and the conductor 366. For example, in FIG. 16, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be formed using a material similar to those for the conductor 328 and the conductor 330.

For example, the insulator 370 is preferably formed using an insulator having a barrier property against hydrogen, like the insulator 324. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 500 can be separated by the barrier layer, so that the diffusion of hydrogen from the transistor 300 to the transistor 500 can be inhibited.

A wiring layer may be provided over the insulator 374 and the conductor 376. For example, in FIG. 16, an insulator 380, an insulator 382, and an insulator 384 are stacked in this order. Moreover, a conductor 386 is formed in the insulator 380, the insulator 382, and the insulator 384. The conductor 386 has a function of a plug or a wiring. Note that the conductor 386 can be formed using a material similar to those for the conductor 328 and the conductor 330.

For example, the insulator 380 is preferably formed using an insulator having a barrier property against hydrogen, like the insulator 324. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 500 can be separated by the barrier layer, so that the diffusion of hydrogen from the transistor 300 to the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. The number of wiring layers similar to the wiring layer including the conductor 356 may be three or less, and the number of wiring layers similar to the wiring layer including the conductor 356 may be five or more.

An insulator 510, an insulator 512, an insulator 514, and an insulator 516 are stacked in this order over the insulator 384. A material with a barrier property against oxygen or hydrogen is preferably used for any of the insulator 510, the insulator 512, the insulator 514, and the insulator 516.

For example, the insulator 510 and the insulator 514 are preferably formed using a film having a barrier property that prevents hydrogen or impurities from the substrate 311, a region where the transistor 300 is provided, or the like from diffusing to a region where the transistor 500 is provided. Therefore, a material similar to that for the insulator 324 can be used.

For the film having a barrier property against hydrogen, silicon nitride formed by a CVD method can be used, for example. The diffusion of hydrogen to a semiconductor element including an oxide semiconductor, such as the transistor 500, may result in degradation of the characteristics of the semiconductor element. Thus, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen used for the insulator 510 and the insulator 514, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

The insulator 512 and the insulator 516 can be formed using a material similar to that for the insulator 320, for example. The use of a material with a relatively low permittivity for these insulators can reduce the parasitic capacitance between wirings. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be formed using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, the diffusion of hydrogen from the transistor 300 to the transistor 500 can be inhibited.

The transistor 500 is provided over the insulator 516.

As illustrated in FIGS. 18(A) and 18(B), the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and has an opening between the conductor 542a and the conductor 542b, an oxide 530c positioned on a bottom surface and a side surface of the opening, an insulator 550 positioned on the formation surface of the oxide 530c, and a conductor 560 positioned on the formation surface of the insulator 550.

As illustrated in FIGS. 18(A) and 18(B), an insulator 544 is preferably provided between the insulator 580 and the oxide 530a, the oxide 530b, the conductor 542a, and the conductor 542b. As illustrated in FIGS. 18(A) and 18(B), the conductor 560 preferably includes a conductor 560a provided on the inner side of the insulator 550 and a conductor 560b provided to be embedded on the inner side of the conductor 560a. As illustrated in FIGS. 18(A) and 18(B), an insulator 574 is preferably provided over the insulator 580, the conductor 560, and the insulator 550.

Hereinafter, the oxide 530a, the oxide 530b, and the oxide 530c may be collectively referred to as an oxide 530.

The transistor 500 has a structure where the three layers of the oxide 530a, the oxide 530b, and the oxide 530c are stacked in the region where the channel is formed and its vicinity; however, the present invention is not limited to this. For example, the transistor may have a single-layer structure of the oxide 530b, a two-layer structure of the oxide 530b and the oxide 530a, a two-layer structure of the oxide 530b and the oxide 530c, or a stacked-layer structure of four or more layers. Although the conductor 560 is shown to have a two-layer structure in the transistor 500, the present invention is not limited to this. For example, the conductor 560 may have a single-layer structure or a stacked-layer structure of three or more layers. The transistor 500 illustrated in FIG. 16 and FIG. 18(A) is just an example and is not limited to the structure shown therein; an appropriate transistor can be used in accordance with a circuit configuration or a driving method.

Here, the conductor 560 functions as a gate electrode of the transistor, and the conductor 542a and the conductor 542b function as a source electrode and a drain electrode. As described above, the conductor 560 is embedded in an opening of the insulator 580 and the region between the conductor 542a and the conductor 542b. The positions of the conductor 560, the conductor 542a, and the conductor 542b are selected in a self-aligned manner with respect to the opening in the insulator 580. That is, in the transistor 500, the gate electrode can be positioned between the source electrode and the drain electrode in a self-aligned manner. Thus, the conductor 560 can be formed without an alignment margin, resulting in a reduction in the area occupied by the transistor 500. Accordingly, miniaturization and high integration of the semiconductor device can be achieved.

Since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and the conductors 542a and 542b can be reduced. As a result, the transistor 500 can have increased switching speed and excellent frequency characteristics.

The conductor 560 functions as a first gate (also referred to as top gate) electrode in some cases. The conductor 503 functions as a second gate (also referred to as bottom gate) electrode in some cases. In that case, the threshold voltage of the transistor 500 can be controlled by changing a potential applied to the conductor 503 independently of a potential applied to the conductor 560. In particular, when a negative potential is applied to the conductor 503, the threshold voltage of the transistor 500 can be higher than 0 V, and the off-state current can be reduced. Thus, a drain current at the time when a potential applied to the conductor 560 is 0 V can be smaller in the case where a negative potential is applied to the conductor 503 than in the case where a negative potential is not applied to the conductor 503.

The conductor 503 is positioned to overlap with the oxide 530 and the conductor 560. Thus, when potentials are applied to the conductor 560 and the conductor 503, an electric field generated from the conductor 560 and an electric field generated from the conductor 503 are connected and can cover the channel formation region formed in the oxide 530. In this specification and the like, a transistor structure in which a channel formation region is electrically surrounded by electric fields of a first gate electrode and a second gate electrode is referred to as a surrounded channel (S-channel) structure.

The conductor 503 has a structure similar to that of the conductor 518; the conductor 503a is formed in contact with an inner wall of an opening in the insulator 514 and the insulator 516, and the conductor 503b is formed further inside. Although the transistor 500 in which the conductor 503a and the conductor 503b are stacked is illustrated, the present invention is not limited thereto. For example, the conductor 503 may have a single-layer structure or a stacked-layer structure of three or more layers.

The conductor 503a is preferably formed using a conductive material having a function of inhibiting diffusion of impurities such as a hydrogen atom, a hydrogen molecule, a water molecule, and a copper atom (a conductive material through which the above impurities are less likely to pass). Alternatively, the conductor 503a is preferably formed using a conductive material having a function of inhibiting diffusion of oxygen (e.g., at least one of oxygen atoms, oxygen molecules, and the like) (a conductive material through which the above oxygen is less likely to pass). Note that in this specification, a function of inhibiting diffusion of impurities or oxygen means a function of inhibiting diffusion of any one or all of the above impurities and the above oxygen.

For example, when the conductor 503a has a function of inhibiting diffusion of oxygen, a reduction in conductivity of the conductor 503b due to oxidation can be inhibited.

When the conductor 503 also functions as a wiring, the conductor 503b is preferably formed using a conductive material that has high conductivity and contains tungsten, copper, or aluminum as its main component. In that case, a conductor 505 does not always need to be provided. Note that the conductor 503b is a single layer in the diagram but may have a stacked-layer structure, for example, a stacked-layer structure of titanium or titanium nitride and any of the above conductive materials.

The insulator 520, the insulator 522, the insulator 524, and the insulator 550 function as a second gate insulating film.

Here, as the insulator 524 in contact with the oxide 530, an insulator containing more oxygen than that in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced, and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

When the insulator 524 includes an excess-oxygen region, the insulator 522 preferably has a function of inhibiting diffusion of oxygen (e.g., oxygen atoms and oxygen molecules) (or that the insulator 522 be less likely to transmit the above oxygen).

The insulator 522 preferably has a function of inhibiting diffusion of oxygen or impurities, in which case diffusion of oxygen contained in the oxide 530 to the insulator 520 side is prevented. Furthermore, the conductor 503 can be prevented from reacting with oxygen in the insulator 524 or the oxide 530.

The insulator 522 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST). As miniaturization and high integration of transistors progress, a problem such as generation of leakage current may arise because of a thinner gate insulating film. When a high-k material is used for an insulator functioning as the gate insulating film, a gate potential at the time when the transistor operates can be reduced while the physical thickness of the gate insulating film is maintained.

It is particularly preferable to use an insulator containing an oxide of one or both of aluminum and hafnium, which is an insulating material having a function of inhibiting diffusion of impurities, oxygen, and the like (i.e., an insulating material through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride are preferable because they are thermally stable. A combination of an insulator of a high-k material and silicon oxide or silicon oxynitride can provide the insulator 520 with a stacked-layer structure having thermal stability and a high dielectric constant.

Note that the transistor 500 in FIGS. 18(A) and 18(B) includes the insulator 520, the insulator 522, and the insulator 524 as the second gate insulating film having a three-layer structure; however, the second gate insulating film may have a single-layer structure, a two-layer structure, or a stacked-layer structure of four or more layers. In that case, the stacked layers are not necessarily formed of the same material and may be formed of different materials.

In the transistor 500, a metal oxide functioning as an oxide semiconductor is preferably used as the oxide 530 including a channel formation region. For example, as the oxide 530, a metal oxide such as an In-M-Zn oxide (the element M is one or more selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is used. The In-M-Zn oxide that can be used as the oxide 530 is particularly preferably a CAAC-OS or a CAC-OS. Alternatively, an In—Ga oxide or an In—Zn oxide may be used as the oxide 530.

The metal oxide functioning as the channel formation region in the oxide 530 has a band gap of preferably 2 eV or higher, further preferably 2.5 eV or higher. The use of a metal oxide having a wide band gap can reduce the off-state current of the transistor.

By including the oxide 530a under the oxide 530b, the oxide 530 can inhibit diffusion of impurities into the oxide 530b from the components formed below the oxide 530a. By including the oxide 530c over the oxide 530b, the oxide 530 can inhibit diffusion of impurities into the oxide 530b from the components formed above the oxide 530c.

The oxide 530 preferably has a stacked-layer structure of oxides that differ in the atomic ratio of metal atoms. Specifically, the atomic proportion of the element M to the constituent elements in the metal oxide used as the oxide 530a is preferably greater than that in the metal oxide used as the oxide 530b. Moreover, the atomic ratio of the element M to In in the metal oxide used as the oxide 530a is preferably greater than that in the metal oxide used as the oxide 530b. Furthermore, the atomic ratio of In to the element M in the metal oxide used as the oxide 530b is preferably greater than that in the metal oxide used as the oxide 530a. The oxide 530c can be formed using a metal oxide that can be used as the oxide 530a or the oxide 530b.

The energy of the conduction band minimum of the oxide 530a and the oxide 530c is preferably higher than that of the oxide 530b. In other words, the electron affinity of the oxide 530a and the oxide 530c is preferably smaller than that of the oxide 530b.

Here, the energy level of the conduction band minimum is gradually varied at junction portions of the oxide 530a, the oxide 530b, and the oxide 530c. In other words, the energy level of the conduction band minimum at the junction portions of the oxide 530a, the oxide 530b, and the oxide 530c is continuously varied or continuously connected. To vary the energy level gradually, the density of defect states in a mixed layer formed at the interface between the oxide 530a and the oxide 530b and the interface between the oxide 530b and the oxide 530c is decreased.

Specifically, when the oxide 530a and the oxide 530b or the oxide 530b and the oxide 530c contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like as the oxide 530a and the oxide 530c.

At this time, the oxide 530b serves as a main carrier path. When the oxide 530a and the oxide 530c have the above structure, the density of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as a tantalum nitride film is preferable because it has a barrier property against hydrogen or oxygen.

Although the conductor 542a and the conductor 542b are each shown as a single-layer structure is shown in FIGS. 18(A) and 18(B), a stacked-layer structure of two or more layers may be employed. For example, a tantalum nitride film and a tungsten film can be stacked. Alternatively, a titanium film and an aluminum film may be stacked. Alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

Other examples include a three-layer structure in which a titanium film or a titanium nitride film is formed, an aluminum film or a copper film is stacked over the titanium film or the titanium nitride film, and a titanium film or a titanium nitride film is formed over the aluminum film or the copper film; and a three-layer structure in which a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 18(A), a region 543a and a region 543b are sometimes formed as low-resistance regions in the oxide 530 at and around the interface with the conductor 542a (the conductor 542b). In this case, the region 543a functions as one of a source region and a drain region, and the region 543b functions as the other of the source region and the drain region. The channel formation region is formed in a region between the region 543a and the region 543b.

When the conductor 542a (the conductor 542b) is provided in contact with the oxide 530, the oxygen concentration of the region 543a (the region 543b) sometimes decreases. In addition, a metal compound layer that contains the metal contained in the conductor 542a (the conductor 542b) and the component of the oxide 530 is sometimes formed in the region 543a (the region 543b). In such cases, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 544. In addition, silicon nitride oxide or silicon nitride can also be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate is preferable because it has higher heat resistance than a hafnium oxide film and thus is less likely to be crystallized by heat treatment in later steps. Note that the insulator 544 is not an essential component when the conductor 542a and the conductor 542b are an oxidation-resistant material or do not significantly lose the conductivity even after absorbing oxygen. Design is appropriately determined in consideration of required transistor characteristics.

The insulator 544 can inhibit impurities such as water and hydrogen contained in the insulator 580 from diffusing into the oxide 530b through the oxide 530c and the insulator 550. The insulator 544 can also inhibit oxidation of the conductor 560 due to excess oxygen contained in the insulator 580.

The insulator 550 functions as a first gate insulating film. The insulator 550 is preferably in contact with the inner side (the top surface and the side surface) of the oxide 530c. Like the insulator 524 described above, the insulator 550 is preferably formed using an insulator that contains excess oxygen and releases oxygen by heating.

Specifically, it is possible to use any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide, each of which contains excess oxygen. In particular, silicon oxide and silicon oxynitride, which have thermal stability, are preferable.

When an insulator from which oxygen is released by heating is provided as the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

In order to efficiently supply excess oxygen of the insulator 550 to the oxide 530, a metal oxide may be provided between the insulator 550 and the conductor 560. The metal oxide preferably inhibits oxygen diffusion from the insulator 550 to the conductor 560. Providing the metal oxide that inhibits oxygen diffusion suppresses diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be suppressed. For the metal oxide, a material that can be used for the insulator 544 is used.

Note that the insulator 550 may have a stacked-layer structure as in the second gate insulating film. With miniaturization and high integration of a transistor, a problem such as generation of leakage current sometimes arises because of a thin gate insulating film. Thus, when an insulator functioning as a gate insulating film has a stacked-layer structure of a high-k material and a thermally stable material, a gate potential at the time of operating the transistor can be reduced while the physical thickness of the gate insulating film is kept. Furthermore, the stacked-layer structure can be thermally stable and have a high dielectric constant.

Although the conductor 560 functioning as the first gate electrode has a two-layer structure in FIGS. 18(A) and 18(B), the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, it is possible to inhibit a reduction in conductivity of the conductor 560b due to oxidation of the conductor 560b caused by oxygen in the insulator 550. As a conductive material having a function of inhibiting oxygen diffusion, tantalum, tantalum nitride, ruthenium, or ruthenium oxide is preferably used, for example. An oxide semiconductor that can be used for the oxide 530 can be used as the conductor 560a. In that case, when the conductor 560b is formed by a sputtering method, the conductor 560a can have a reduced electric resistance and become a conductor. Such a conductor can be referred to as an oxide conductor (OC) electrode.

The conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and any of the above conductive materials.

The insulator 580 is provided over the conductor 542a and the conductor 542b with the insulator 544 positioned therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Silicon oxide and silicon oxynitride are particularly preferable in terms of high thermal stability. Silicon oxide and porous silicon oxide are particularly preferable because an excess-oxygen region can be formed easily in a later step.

The insulator 580 preferably includes an excess-oxygen region. When the insulator 580 from which oxygen is released by heating is provided in contact with the oxide 530c, oxygen in the insulator 580 can be efficiently supplied to the oxide 530 through the oxide 530c. The concentration of impurities such as water or hydrogen in the insulator 580 is preferably lowered.

The opening in the insulator 580 overlaps with the region between the conductor 542a and the conductor 542b. Accordingly, the conductor 560 is embedded in the opening of the insulator 580 and the region between the conductor 542a and the conductor 542b.

For miniaturization of the semiconductor device, the gate length needs to be short, but it is necessary to prevent a reduction in conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is provided to be embedded in the opening of the insulator 580 in this embodiment.

The insulator 574 is preferably provided in contact with the top surface of the insulator 580, the top surface of the conductor 560, and the top surface of the insulator 550. When the insulator 574 is formed by a sputtering method, an excess-oxygen region can be provided in the insulator 550 and the insulator 580. Thus, oxygen can be supplied from the excess-oxygen regions to the oxide 530.

For example, a metal oxide containing one or more selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, an aluminum oxide film formed by a sputtering method can serve both as an oxygen supply source and as a barrier film against impurities such as hydrogen.

An insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are provided in openings formed in the insulator 581, the insulator 574, the insulator 580, and the insulator 544. The conductor 540a and the conductor 540b are provided to face each other with the conductor 560 positioned therebetween. The conductor 540a and the conductor 540b each have a structure similar to that of a conductor 546 and a conductor 548 that will be described later.

An insulator 582 is provided over the insulator 581. A substance having a barrier property against oxygen and hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture that cause a change in the electrical characteristics of the transistor. Accordingly, the use of aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

An insulator 586 is provided over the insulator 582. The insulator 586 can be formed using a material similar to that for the insulator 320. The use of a material with a relatively low permittivity for these insulators can reduce the parasitic capacitance between wirings. For example, a silicon oxide film or a silicon oxynitride film can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 function as plugs or wirings that are connected to the capacitor 600, the transistor 500, or the transistor 300. The conductor 546 and the conductor 548 can be formed using a material similar to those for the conductor 328 and the conductor 330.

The capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed at the same time.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 16; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided so as to overlap with the conductor 610 with the insulator 630 positioned therebetween. The conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, can be used.

An insulator 650 is provided over the conductor 620 and the insulator 630. The insulator 650 can be formed using a material similar to that for the insulator 320. The insulator 650 may function as a planarization film that covers an uneven shape thereunder.

With the use of this structure, a change in electrical characteristics can be reduced and the reliability can be improved in a semiconductor device including a transistor including an oxide semiconductor. Alternatively, a semiconductor device using a transistor including an oxide semiconductor can be miniaturized or highly integrated.

Notes on Description of This Specification and the Like

The following are notes on the description of the structures in the above embodiments and embodiments.

One embodiment of the present invention can be constituted by appropriately combining the structure described in an embodiment with any of the structures described in the other embodiments. In addition, in the case where a plurality of structure examples are described in one embodiment, the structure examples can be combined with each other as appropriate.

Note that a content (or part thereof) in an embodiment can be applied to, combined with, or replaced with another content in the same embodiment and/or a content (or part thereof) in another embodiment or other embodiments.

Note that in each embodiment, a content described in the embodiment is a content described with reference to a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be created.

In this specification and the like, components are classified on the basis of the functions and shown as blocks independent of each other in block diagrams. However, in an actual circuit or the like, it may be difficult to separate components on the basis of the functions, so that one circuit may be associated with a plurality of functions or several circuits may be associated with one function. Therefore, the segmentation of a block in the block diagrams is not limited by any of the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In this specification and the like, the expressions "one of a source and a drain" (or a first electrode or a first terminal) and "the other of the source and the drain" (or a second electrode or a second terminal) are used to describe the connection relation to a source and a drain of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Moreover, the term "electrode" or "wiring" also includes the case where a plurality of "electrodes" or "wirings" are formed in an integrated manner, for example.

In this specification and the like, voltage and potential can be interchanged with each other as appropriate. The term "voltage" refers to a potential difference from a reference potential. When the reference potential is a ground voltage, for example, "voltage" can be replaced with "potential". The ground potential does not necessarily mean 0 V. Potentials are relative values, and the potential applied to a wiring or the like is changed depending on the reference potential, in some cases.

Note that in this specification and the like, the terms such as "film" and "layer" can be interchanged with each other depending on the case or circumstances. For example, the term "conductive layer" can be changed into the term "conductive film" in some cases. For another example, the term "insulating film" can be changed into the term "insulating layer" in some cases.

In this specification and the like, a switch is in a conduction state (on state) or in a non-conduction state (off state) to determine whether current flows therethrough or not. Alternatively, a switch has a function of selecting and changing a current path.

In this specification and the like, the channel length refers to, for example, the distance between a source and a drain in a region where a semiconductor (or a portion where current flows in a semiconductor when a transistor is on) and a gate overlap each other, or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap each other, or a region where a channel is formed.

In this specification and the like, the expression "A and B are connected" means the case where A and B are electrically connected as well as the case where A and B are directly connected. Here, the expression "A and B are electrically connected" means the case where electric signals can be transmitted and received between A and B when an object having any electric action exists between A and B.

REFERENCE NUMERALS

10: memory unit, 10A: memory unit, 20A: memory circuit, 20B: memory circuit, 21A: memory circuit, 21B: memory circuit, 21C: memory circuit, 21D: memory circuit, 22A: memory circuit, 22B: memory circuit, 22C: memory circuit, 22D: memory circuit, 26A: memory circuit, 26B: memory circuit, 27A: memory circuit, 27B: memory circuit, 27C: memory circuit, 27D: memory circuit, 28A: memory circuit, 28B: memory circuit, 28C: memory circuit, 28D: memory circuit, 30: circuit, 31: circuit, 40: input/output circuit, 50: control unit, 50A: control unit, 60: sensor unit, 70: external circuit, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 500: transistor, 503: conductor, 503a: conductor, 503b: conductor, 505: conductor, 510: insulator, 512: insulator, 514: insulator, 516: insulator, 518: conductor, 520: insulator, 522: insulator, 524: insulator, 530: oxide, 530a: oxide, 530b: oxide, 530c: oxide, 540a: conductor, 540b: conductor, 542a: conductor, 542b: conductor, 543a: region, 543b: region, 544: insulator, 546: conductor, 548: conductor, 550: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 650: insulator, 1201: guardrail, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 2120: flying object, 2121: arithmetic device, 2122: camera, 2123: propeller, 2910: information terminal, 2911: housing, 2912: display portion, 2913: camera, 2914: speaker portion, 2915: operation switch, 2916: external connection port, 2917: microphone, 2920: cleaning robot, 2921: housing, 2922: display portion, 2923: operation button, 2924: camera, 2925: brush, 2980: automobile, 2981: camera, 5101: display, 5103: brush

The invention claimed is:

1. A semiconductor device comprising:
a control unit;
a memory unit; and
a sensor unit,
wherein the memory unit comprises a first memory circuit part, a second memory circuit part, and a switching circuit provided between the first memory circuit part and the second memory circuit part,
wherein the first memory circuit part comprises a plurality of first memory circuits,
wherein the second memory circuit part comprises a plurality of second memory circuits,
wherein the switching circuit is configured to switch transmission of information between the plurality of first memory circuits and the plurality of second memory circuits,
wherein each of the plurality of first memory circuits comprises a first transistor having a first semiconductor layer comprising a first oxide semiconductor,
wherein each of the plurality of first memory circuits comprises a second transistor having a second semiconductor layer comprising a second oxide semiconductor,
wherein the switching circuit comprises a third transistor and a fourth transistor,
wherein the control unit is configured to supply signals to the first transistor, the second transistor, and the third transistor, in accordance with a signal obtained at the sensor unit, and
wherein an information storage period of each of the plurality of first memory circuits is longer than an information storage period of each of the plurality of second memory circuits.

2. The semiconductor device according to claim 1, wherein the switching circuit is configured to control amount of current flowing between the first memory circuit part and the second memory circuit part.

3. The semiconductor device according to claim 1, wherein the first transistor comprises a first gate electrode and a first back gate electrode overlapping with each other with the first semiconductor layer provided therebetween, and
wherein the second transistor comprises a second gate electrode and a second back gate electrode overlapping with each other with the second semiconductor layer provided therebetween.

4. The semiconductor device according to claim 1, wherein the third transistor comprises a third semiconductor layer comprising a third oxide semiconductor, a third gate electrode over the third semiconductor layer, and a third back gate electrode under the third semiconductor layer.

5. The semiconductor device according to claim 1, wherein the fourth transistor is a p-channel transistor.

6. The semiconductor device according to claim 1, wherein the sensor unit comprises at least one of a brain wave sensor, a pulse wave sensor, a blood pressure sensor, and a temperature sensor.

7. The semiconductor device according to claim 1, wherein the switching circuit is a programmable device being able to store configuration data.

8. A semiconductor device comprising:
a control unit;
a memory unit;

a sensor unit; and a circuit configured to transmit and receive information to and from the memory unit, wherein the memory unit comprises a first memory circuit part, a second memory circuit part, and a switching circuit provided between the first memory circuit part and the second memory circuit part, wherein the first memory circuit part comprises a plurality of first memory circuits, wherein the second memory circuit part comprises a plurality of second memory circuits, wherein the switching circuit is configured to switch transmission of information between the plurality of first memory circuits and the plurality of second memory circuits, wherein each of the plurality of first memory circuits comprises a first transistor having a first semiconductor layer comprising a first oxide semiconductor, wherein each of the plurality of first memory circuits comprises a second transistor having a second semiconductor layer comprising a second oxide semiconductor, wherein the switching circuit comprises a third transistor and a fourth transistor, wherein the control unit is configured to signals supplied to the first transistor, the second transistor, and the third transistor in accordance with a signal obtained at the sensor unit, and wherein an information storage period of each of the plurality of first memory circuits is longer than an information storage period of each of the plurality of second memory circuits.

9. The semiconductor device according to claim 8, wherein the switching circuit is configured to control amount of current flowing between the first memory circuit part and the second memory circuit part.

10. The semiconductor device according to claim 8, wherein the first transistor comprises a first gate electrode and a first back gate electrode overlapping with each other with the first semiconductor layer provided therebetween, and wherein the second transistor comprises a second gate electrode and a second back gate electrode overlapping with each other with the second semiconductor layer provided therebetween.

11. The semiconductor device according to claim 8, wherein the third transistor comprises a third semiconductor layer comprising a third oxide semiconductor, a third gate electrode over the third semiconductor layer, and a third back gate electrode under the third semiconductor layer.

12. The semiconductor device according to claim 8, wherein the fourth transistor is a p-channel transistor.

13. The semiconductor device according to claim 8, wherein the sensor unit comprises at least one of a brain wave sensor, a pulse wave sensor, a blood pressure sensor, and a temperature sensor.

14. The semiconductor device according to claim 8, wherein the switching circuit is a programmable device being able to store configuration data.

15. The semiconductor device according to claim 8, wherein the circuit is electrically connected to a display device.

16. The semiconductor device according to claim 8, wherein the circuit is electrically connected to an actuator device.

* * * * *